United States Patent
Ooishi

(10) Patent No.: US 6,597,601 B2
(45) Date of Patent: Jul. 22, 2003

(54) THIN FILM MAGNETIC MEMORY DEVICE CONDUCTING DATA READ OPERATION WITHOUT USING A REFERENCE CELL

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/164,548

(22) Filed: Jun. 10, 2002

(65) Prior Publication Data

US 2003/0107916 A1 Jun. 12, 2003

(30) Foreign Application Priority Data

Dec. 12, 2001 (JP) .......................... 2001-378820

(51) Int. Cl.$^7$ ............................ G11C 11/14; G11C 11/00
(52) U.S. Cl. ......................... 365/171; 365/158; 365/207; 365/209
(58) Field of Search ................................ 365/158, 171, 365/173, 207, 209

(56) References Cited

U.S. PATENT DOCUMENTS

| 6,256,247 B1 | 7/2001 | Perner | 365/209 |
| 6,317,376 B1 | 11/2001 | Tran et al. | 365/210 |
| 6,487,109 B2 * | 11/2002 | Thewes et al. | 365/158 |
| 6,525,978 B2 * | 2/2003 | Weber et al. | 365/207 |

OTHER PUBLICATIONS

Scheuerlin, et al., "A 10ns Read and Write Non–Volatile Memory Array Using a Magnetic Tunnel Junction and FET Switch in Each Cell" ISSCC Digest of Technical Papers, TA7.2, Feb. 2000, pp. 94–95, 128–129, 409–410.

Durlam, et al. "Nonvolatile RAM Based on Magnetic Tunnel Junction Elements" ISSCC Digest of Technical Papers, TA7.3, Feb. 2000, pp. 96–97, 130–131 and 410–411.

* cited by examiner

*Primary Examiner*—Son Mai
(74) *Attorney, Agent, or Firm*—McDermott, Will & Emery

(57) ABSTRACT

In data read operation, a data line receives a data read current from a data read current supply circuit, and is electrically coupled to a selected memory cell. A switch circuit sequentially connects first to third nodes to the data line one by one. Read data indicating storage data of the selected memory cell is produced based on comparison between the respective voltages on the first to third nodes held by first to third voltage holding capacitors. The switch circuit transmits a data line voltage corresponding to the storage data of the selected memory cell to the first node, a data line voltage corresponding to data "1" stored in the selected memory cell to the second node, and a data line voltage corresponding to data "0" stored in the selected memory cell to the third node.

14 Claims, 17 Drawing Sheets

US 6,597,601 B2

THIN FILM MAGNETIC MEMORY DEVICE CONDUCTING DATA READ OPERATION WITHOUT USING A REFERENCE CELL

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 17 schematically shows the structure of a memory cell having a magnetic tunnel junction (hereinafter, sometimes simply referred to as "MTJ memory cell").

Referring to FIG. 17, the MTJ memory cell includes a tunneling magneto-resistance element TMR having its electric resistance varying according to a magnetically written storage data level, and an access transistor ATR. Access transistor ATR is connected in series with tunneling magneto-resistance element TMR between a write bit line WBL and a read bit line RBL. A field effect transistor formed on a semiconductor substrate is typically used as access transistor ATR.

A write bit line WBL, a write digit line WDL, a word line WL and a read bit line RBL are provided for the MTJ memory cell. Write bit line WBL and write digit line WDL pass data write currents of different directions therethrough in data write operation, respectively. Word line WL is used to conduct data read operation. Read bit line RBL receives a data read current. In data read operation, tunneling magneto-resistance element TMR is electrically coupled between write bit line WBL having a ground voltage GND and read bit line RBL in response to turning-ON of access transistor ATR.

FIG. 18 is a conceptual diagram illustrating data write operation to the MTJ memory cell.

Referring to FIG. 18, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction according to an external magnetic field (hereinafter, sometimes simply referred to as "free magnetic layer"). A tunneling barrier (tunneling film) TB of an insulator film is interposed between fixed magnetic layer FL and free magnetic layer VL. Free magnetic layer VL is magnetized either in the direction that is the same as or opposite (antiparallel) to that of fixed magnetic layer FL according to a write data level. Fixed magnetic layer FL, tunneling barrier TB and free magnetic layer VL form a magnetic tunnel junction.

The electric resistance of tunneling magneto-resistance element TMR varies according to the relation between the respective magnetization directions of fixed magnetic layer FL and free magnetic layer VL. More specifically, the electric resistance of tunneling magneto-resistance element TMR is minimized (Rmin) when fixed magnetic layer FL and free magnetic layer VL have parallel magnetization directions, and is maximized (Rmax) when they have opposite (antiparallel) magnetization directions.

In data write operation, word line WL is inactivated and access transistor ATR is turned OFF. In this state, a data write current for magnetizing free magnetic layer VL is applied to each of write bit line WBL and write digit line WDL in a direction according to the write data level.

FIG. 19 is a conceptual diagram illustrating the relation between the data write current and the magnetization direction of the tunneling magneto-resistance element in the data write operation.

Referring to FIG. 19, the abscissa H(EA) indicates a magnetic field that is applied to free magnetic layer VL of tunneling magneto-resistance element TMR in the easy-axis (EA) direction. The ordinate H(HA) indicates a magnetic field that is applied to free magnetic layer VL in the hard-axis (HA) direction. Magnetic fields H(EA), H(HA) respectively correspond to two magnetic fields produced by the currents flowing through write bit line WBL and write digit line WDL.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0"). The MTJ memory cell is thus capable of storing 1-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line shown in the figure. In other words, the magnetization direction of free magnetic layer VL will not change if an applied data write magnetic field corresponds to the region inside the asteroid characteristic line.

As shown by the asteroid characteristic line, applying a magnetic field of the hard-axis direction to free magnetic layer VL enables reduction in a magnetization threshold value required to switch the magnetization direction along the easy axis.

When the operation point of the data write operation is designed as in the example of FIG. 19, a data write magnetic field of the easy-axis direction is designed to have a strength $H_{WR}$ in the MTJ memory cell to be written. In other words, the data write current to be applied to write bit line WBL or write digit line WDL is designed to produce the data write magnetic field $H_{WR}$. In general, data write magnetic field $H_{WR}$ is defined by the sum of a switching magnetic field $H_{SW}$ required to switch the magnetization direction and a margin $\Delta H$. Data write magnetic field $H_{WR}$ is thus defined by $H_{WR}=H_{SW}+\Delta H$.

In order to rewrite the storage data of the MTJ memory cell, that is, the magnetization direction of tunneling magneto-resistance element TMR, a data write current of at least a prescribed level must be applied to both write digit line WDL and write bit line WBL. Free magnetic layer VL in tunneling magneto-resistance element TMR is thus magnetized in the direction parallel or opposite (antiparallel) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

FIG. 20 is a conceptual diagram illustrating data read operation from the MTJ memory cell.

Referring to FIG. 20, in data read operation, access transistor ATR is turned ON in response to activation of word line WL. Write bit line WBL is set to ground voltage GND. As a result, tunneling magneto-resistance element TMR pulled down to ground voltage GND is electrically coupled to read bit line RBL.

If read bit line RBL is then pulled up to a prescribed voltage, a memory cell current Icell according to the electric resistance of tunneling magneto-resistance element TMR, that is, the storage data level of the MTJ memory cell, flows through a current path including read bit line RBL and tunneling magneto-resistance element TMR. For example, the storage data can be read from the MTJ memory cell based on comparison between memory cell current I cell and a prescribed reference current.

The electric resistance of tunneling magneto-resistance element TMR thus varies according to the magnetization direction that is rewritable by an applied data write magnetic field. Accordingly, non-volatile data storage can be realized by using electric resistances Rmax and Rmin of tunneling magneto-resistance element TMR as the respective storage data levels ("1" and "0").

The MRAM device stores data by using the difference between junction resistances (ΔR=Rmax−Rmin) that corresponds to the difference in storage data level in tunneling magneto-resistance element TMR.

In general, the MRAM device includes reference cells for producing a reference current to be compared with a memory cell current I cell, in addition to the normal MTJ memory cells for storing data. The reference cells are designed to produce a reference current that is equal to an intermediate value of the two memory cell currents I cell respectively corresponding to the two electric resistances Rmax and Rmin of the MTJ memory cell. Basically, these reference cells are designed and fabricated in the same manner as that of the normal MTJ memory cells. In other words, the reference cells also include a tunneling magneto-resistance element TMR having a magnetic tunnel junction.

However, a current passing through tunneling magneto-resistance element TMR is significantly affected by the thickness of an insulating film used as a tunneling film. Accordingly, if the normal MTJ memory cell and the reference cell have any difference in thickness of the tunneling film, it would be difficult to set the reference current to the level that allows the small current difference to be sensed. This may possibly reduce the accuracy of the data read operation.

In particular, in a common MTJ memory cell, the resistance difference ΔR produced according to the storage data level is not so large. Typically, electric resistance Rmin is at most about several tens of percents of Rmax. Memory cell current Icell therefore varies at most on the order of microamperes ($\mu$A: $10^{-6}$ A) according to the storage data level.

Accordingly, the respective tunneling films of the normal MTJ memory cell and the reference cell must be formed with an accurate thickness.

However, such a strict manufacturing process regarding accuracy of the thickness of the tunneling film may reduce the manufacturing yield, thereby possibly increasing the manufacturing costs. Accordingly, there is a demand for the MRAM device capable of accurately conducting data read operation based on the resistance difference ΔR in the MTJ memory cell without requiring a strict manufacturing process.

SUMMARY OF THE INVENTION

It is an object of the present invention to provide a thin film magnetic memory device capable of conducting accurate data read operation without using a reference cell.

In summary, according to the present invention, a thin film magnetic memory device includes a plurality of memory cells, a data line, a read current supply circuit, and a data read circuit.

Each memory cell is magnetized in a direction according to storage data thereof having either a first or second level. Each memory cell has an electric resistance according to a magnetization direction. The data line is electrically coupled to a selected memory cell for a prescribed period in data read operation. The read current supply circuit supplies a data read current to the data line in order to produce a voltage according to the electric resistance of the selected memory cell onto the data line. The data read circuit produces read data corresponding to the storage data of the selected memory cell, based on a voltage on the data line electrically coupled to the selected memory cell in a first state and a voltage on the data line electrically coupled to the selected memory cell in a second state. The first state is a state where the selected memory cell has a same magnetization direction as before the data read operation. The second stage is a state after the selected memory cell is subjected to a prescribed magnetic field.

The above thin film magnetic memory device is capable of conducting data read operation by merely accessing the selected memory cell without using a reference cell. In other words, the above thin film magnetic memory device is capable of conducting data read operation based on the comparison between voltages obtained by the same data read path including the same memory cell, data line and the like. Accordingly, the data read operation can be conducted with improved accuracy without being subjected to the influences such as an offset resulting from manufacturing variation of the circuits included in the data read path.

Preferably, the thin film magnetic memory device further includes a write control circuit for writing the storage data to one of the plurality of memory cells. The selected memory cell changes from the first state to the second state when the write control circuit writes storage data of a prescribed level thereto in a single data read operation. The write control circuit rewrites storage data having a same level as that of the produced read data to the selected memory cell in the single data read operation.

The above thin film magnetic memory device is capable of conducting data read operation from the selected memory cell without using a reference cell. In a single data read operation, the above thin film magnetic memory device reads storage data from the selected memory cell before and after writing data of a prescribed level thereto, and produces read data based on the comparison therebetween. Moreover, the read data is rewritten to the selected memory cell in the single data read operation. This enables the selected memory cell to restore to the state before the data read operation.

More preferably, the write control circuit skips the rewrite operation when the storage data in the selected memory cell has a same level as that of the produced read data before the rewrite operation.

As a result, an unnecessary rewrite operation is omitted, enabling reduction in current consumption of the data read operation.

Preferably, a single data read operation includes an initial read operation for obtaining a voltage on the data line electrically coupled to the selected memory cell in the first state, a first prescribed write operation for writing data having a prescribed level to the selected memory cell, a first prescribed read operation for obtaining a voltage on the data line electrically coupled to the selected memory cell after the first prescribed write operation, a read data determining operation for determining the read data after the first prescribed read operation based on the respective voltages on the data line obtained in the initial read operation and the first prescribed read operation, and a rewrite operation for rewriting the storage data having a same level as that of the determined read data to the selected memory cell after the read data determining operation.

The above thin film magnetic memory device is capable of conducting data read operation from the selected memory cell without using a reference cell. In a single data read operation, the above thin film magnetic memory device reads storage data from the selected memory cell before and after writing data of a prescribed level thereto, and produces read data based on the comparison therebetween. Moreover, the read data is rewritten to the selected memory cell in the single data read operation. This enables the selected memory cell to restore to the state before the data read operation.

Preferably, each memory cell is magnetized along an easy-axis direction according to the storage data. The thin film magnetic memory device further includes a bias magnetic field applying portion for applying a prescribed bias magnetic field to the selected memory cell. The prescribed bias magnetic field has a component along a hard-axis direction. The selected memory cell changes from the first state to the second state when the bias magnetic field is applied thereto.

More preferably, the data read circuit includes a sense amplifier for amplifying a voltage difference between the data line electrically coupled to the selected memory cell and a first node, a voltage holding portion for holding a voltage on the first node, a switch circuit for connecting an output node of the sense amplifier to the first node in the first state, and disconnecting the output node of the sense amplifier from the first node in the second state, and a read data producing circuit for producing the read data according to a voltage on the output node in the second state.

Accordingly, a data line voltage corresponding to the storage data of the selected memory cell can be obtained by using negative feedback of the sense amplifier. This suppresses an offset produced in the sense amplifier, enabling further improvement in accuracy of the data read operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the accompanying drawings.

First Embodiment

Figure 1:
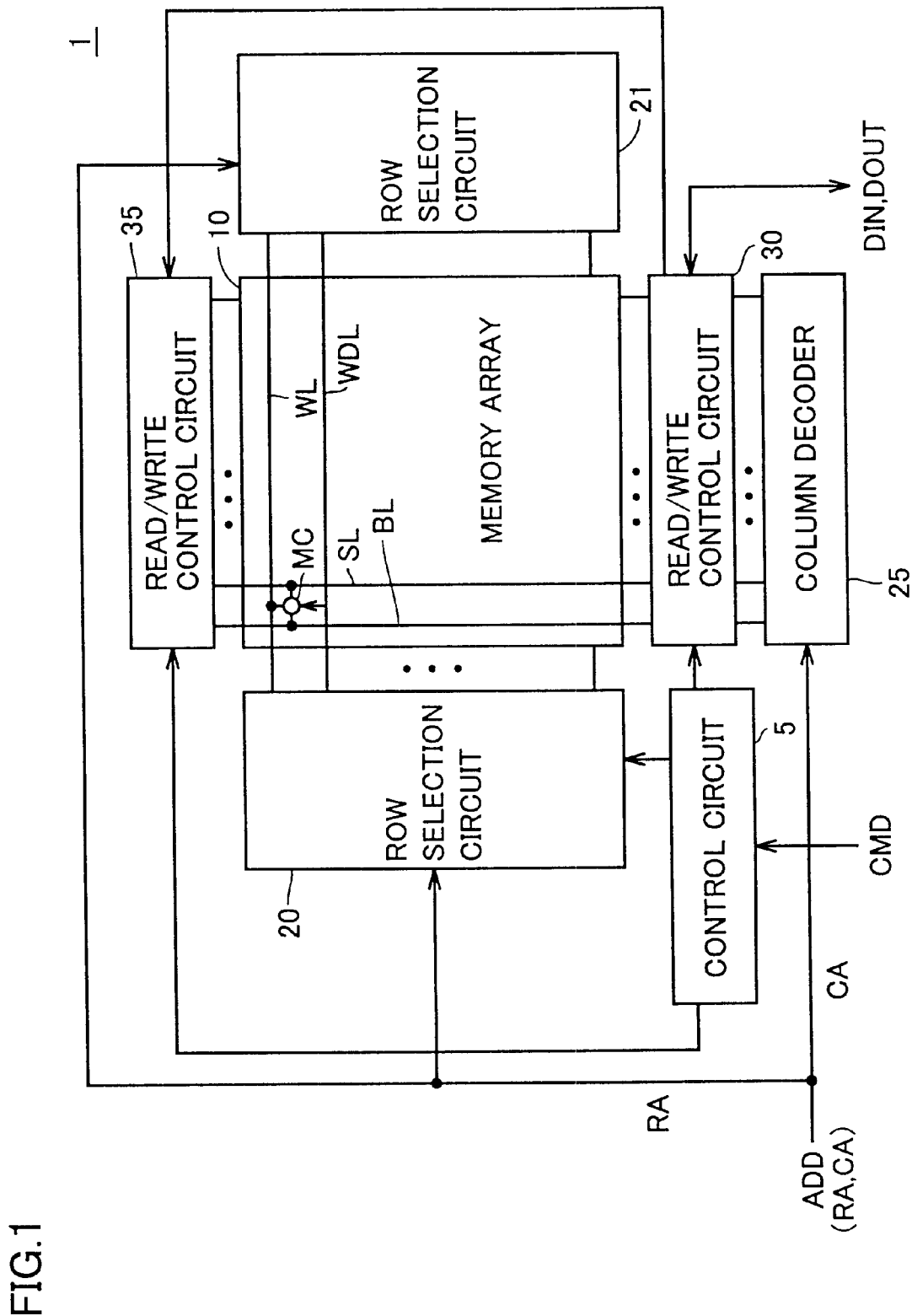
FIG. 1 is a schematic block diagram of the overall structure of an MRAM device 1 according to an embodiment of the present invention.

Referring to FIG. 1, an MRAM device 1 according to an embodiment of the present invention conducts random access in response to an external control signal CMD and an external address signal ADD to write input data DIN to, or read output data DOUT from, a memory cell selected for data write or read operation (hereinafter, sometimes referred to as "selected memory cell").

MRAM device 1 includes a control circuit 5 for controlling the overall operation of MRAM device 1 in response to control signal CMD, and a memory array 10 having MTJ memory cells MC arranged in a matrix.

In memory array 10, word lines WL and write digit lines WDL are arranged corresponding to the respective MTJ memory cell rows, and bit lines BL and source lines SL are arranged corresponding to the respective MTJ memory cell columns. FIG. 1 exemplarily shows a single MTJ memory cell MC, and a corresponding word line WL, write digit line WDL, bit line BL and source line SL.

MRAM device 1 further includes row selection circuits 20, 21 for selecting a row in memory array 10 according to a row address RA of address signal ADD, a column decoder 25 for selecting a column in memory array 10 according to a column address CA of address signal ADD, and read/write control circuits 30, 35.

Read/write control circuits 30, 35 each collectively refers to a circuit group for conducting data read operation and data write operation from and to an MTJ memory cell MC in the memory array 10.

Hereinafter, a secondary high-voltage state (e.g., power supply voltage Vcc) and a secondary low-voltage state (e.g., ground voltage GND) of a signal, signal line, data and the like are sometimes referred to as "H level" and "L level", respectively.

Figure 2:
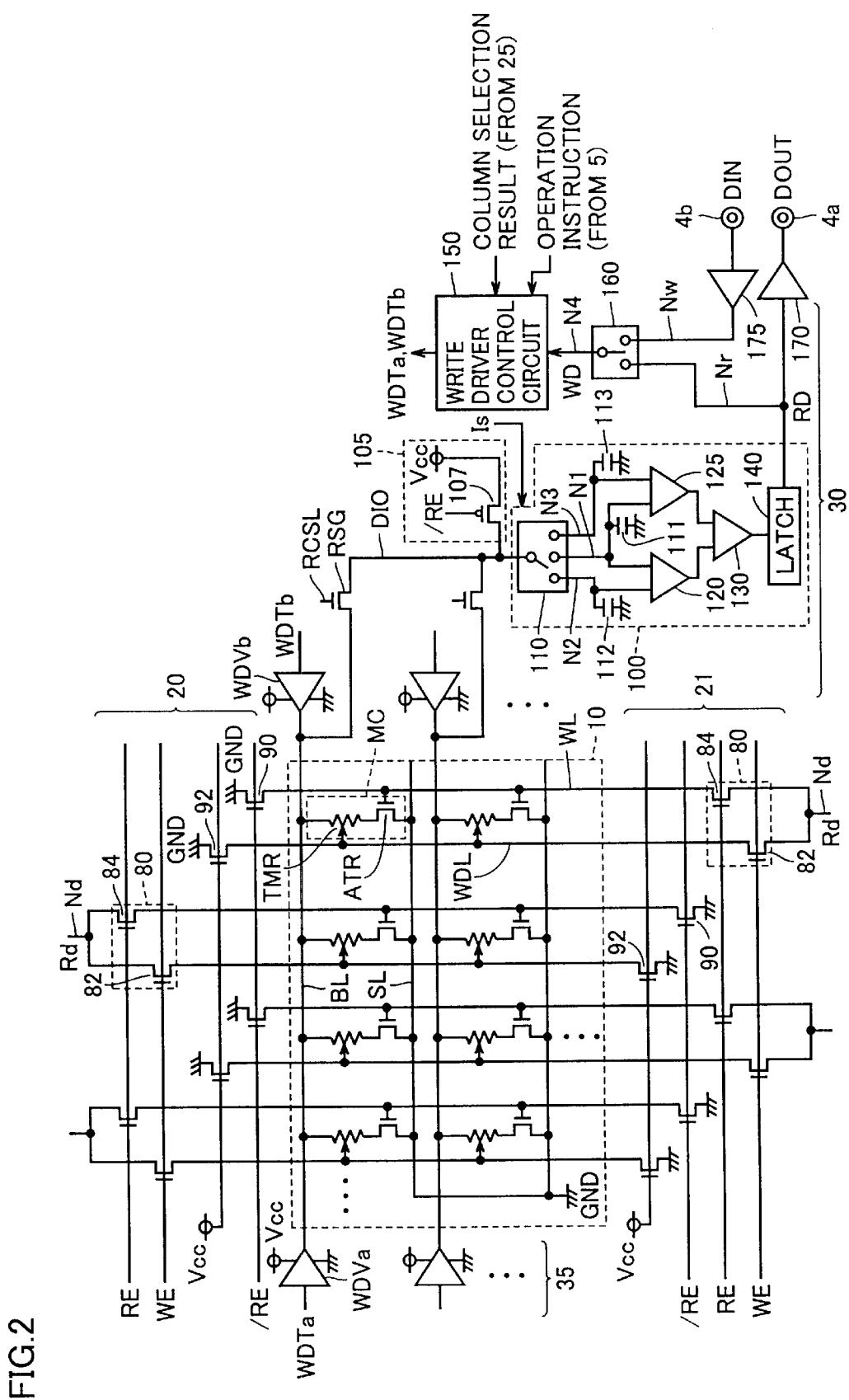
FIG. 2 is a circuit diagram of the structure of a read/write control circuit of a first embodiment for conducting data read operation and data write operation to and from a memory array.
Figure 17:
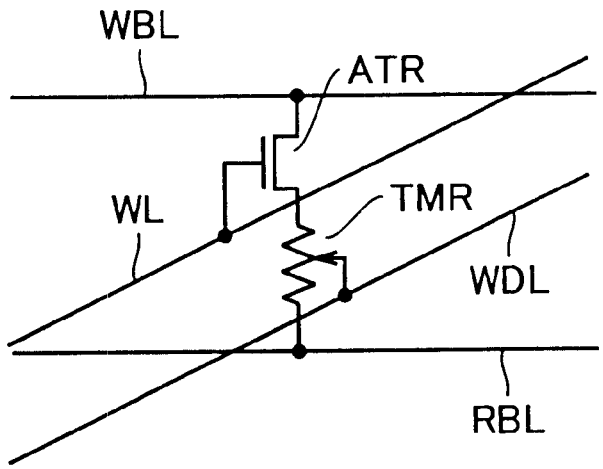
FIG. 17 schematically shows the structure of an MTJ memory cell.
Figure 18:
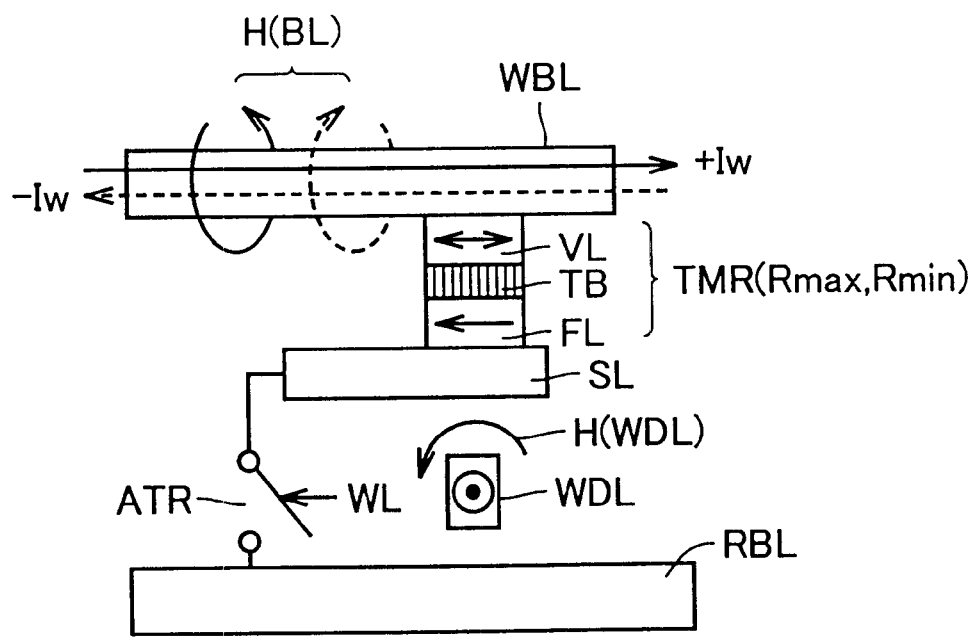
FIG. 18 is a conceptual diagram illustrating data write operation to the MTJ memory cell.
Figure 19:
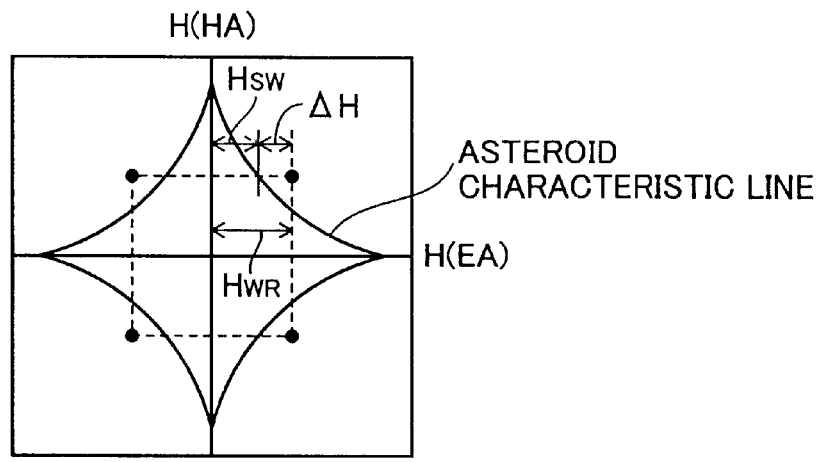
FIG. 19 is a conceptual diagram illustrating the relation between a data write current and the magnetization direction of a tunneling magneto-resistance element in the data write operation.
Figure 20:
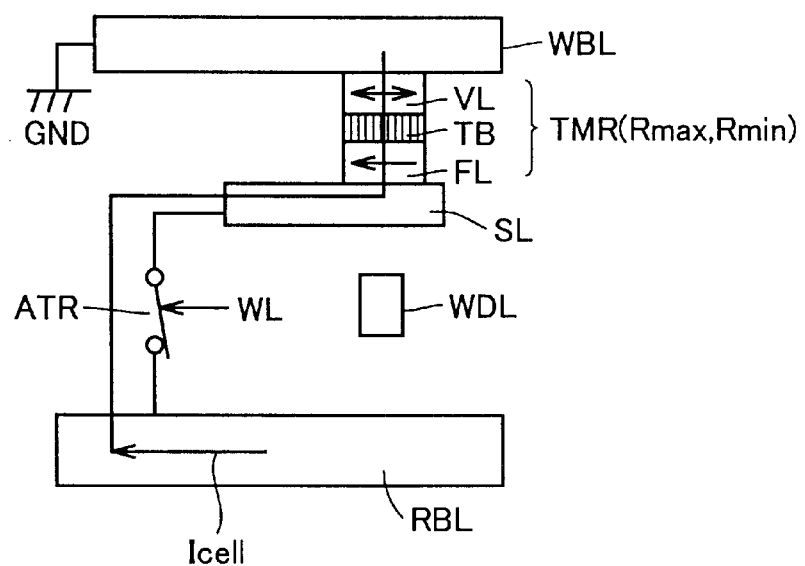
FIG. 20 is a conceptual diagram illustrating data read operation from the MTJ memory cell.

Referring to FIG. 2, memory array 10 includes MTJ memory cells MC arranged in a matrix. As described before, word lines WL and word digit lines WDL are arranged corresponding to the respective memory cell rows, and bit lines BL and source lines SL are arranged corresponding to the respective memory cell columns. Each MTJ memory cell MC has the same structure as that described in connection with FIG. 17. More specifically, each MTJ memory cell MC includes a tunneling magneto-resistance element TMR and an access transistor ATR which are connected in series between a corresponding bit line BL and a corresponding source line SL.

As described before, tunneling magneto-resistance element TMR has an electric resistance according to the magnetization direction. More specifically, before data read operation, tunneling magneto-resistance element TMR in each MTJ memory cell MC is magnetized along a prescribed direction in order to store either H-level ("1") or L-level ("0") data. The electric resistance of the tunneling magneto-resistance element TMR is thus set to either Rmax or Rmin.

Each source line SL is coupled to ground voltage GND. The source voltage of each access transistor ATR is thus fixed to ground voltage GND. When a word line WL of the selected row is activated to H level, a corresponding tunneling magneto-resistance element TMR pulled down to ground voltage GND is connected to bit line BL.

Hereinafter, the structure of row selection circuits 20, 21 for selecting a row in memory array 10 will be described.

Row selection circuits 20, 21 include row drivers 80 corresponding to the respective memory cell rows. Each row driver 80 controls activation of a corresponding word line WL and write digit line WDL based on a decode signal Rd indicating the decode result of a corresponding memory cell row.

Decode signal Rd, which is produced by a not-shown decode circuit, is set to H level (power supply voltage Vcc) when a corresponding memory cell row is selected. In other words, a node Nd of the selected row is set to H level (power supply voltage Vcc). The other nodes Nd are set to L level (ground voltage GND). In at least one data read operation and one data write operation, a not-shown latch portion holds decode signal Rd of each memory cell row at a corresponding node Nd.

Each row driver 80 includes transistor switches 82, 84. Transistor switch 82 is provided between a corresponding node Nd and one end of a corresponding write digit line WDL, and transistor switch 84 is provided between a corresponding node Nd and one end of a corresponding word line WL. Transistor switch 82 receives a control signal WE at its gate. Control signal WE is activated to H level in data write operation to the MTJ memory cell. Transistor switch 84 receives a control signal RE at its gate. Control signal RE is activated to H level in data read operation from the MTJ memory cell.

Accordingly, in each row driver 80, transistor switch 82 is turned ON and transistor switch 84 is turned OFF in data write operation. In data read operation, transistor switch 84 is turned ON and transistor switch 82, is turned OFF.

Moreover, transistor switches 90, 92 are arranged in each the memory cell row. In operation other than data read operation (that is, in operation including data write operation), each transistor switch 90 couples the other end of a corresponding word line WL to ground voltage GND, and each transistor switch 92 couples the other end of write digit line WDL to ground voltage GND. In each memory cell row, transistor switches 90, 92 face a corresponding row driver 80 with memory array 10 interposed therebetween.

Transistor switch 90 receives an inverted signal /RE of control signal RE at its gate, and is electrically coupled between a corresponding word line WL and ground voltage GND. Transistor switch 92 has its gate coupled to power supply voltage Vcc, and is electrically coupled between a corresponding write digit line WDL and ground voltage GND. In the example of FIG. 2, transistor switches 82, 84, 90, 92 are each formed from an N-channel MOS (Metal Oxide Semiconductor) transistor.

In data write operation, transistor switch 82 is turned ON in response to a control signal WE, and activates a corresponding write digit line WDL based on a voltage of a corresponding node Nd, that is, a decode signal Rd of a corresponding memory cell row. Write digit line WDL thus activated is connected to H-level node Nd (power supply voltage Vcc). Therefore, a data write current Ip flows from a corresponding row driver 80 toward a corresponding transistor switch 92 in the ON state.

In data read operation, transistor switch 90 disconnects a corresponding word line WL from ground voltage GND. Transistor switch 84 is turned ON in response to a control signal RE, and activates a corresponding word line WL based on a voltage of a corresponding node Nd, that is, a decode signal Rd of a corresponding memory cell row. Word line WL thus activated is connected to H-level node Nd (power supply voltage Vcc). Accordingly, the node of an access transistor ATR of the selected row is turned ON, and a tunneling magneto-resistance element TMR is electrically coupled between a corresponding bit line BL and a corresponding source line SL. The row selection operation in memory array 10 is thus conducted.

The same structure is provided for word line WL and write digit line WDL of each memory cell row. Note that, as shown in FIG. 2, row drivers 80 of the respective memory cell rows are arranged in a staggered manner. In other words, row drivers 80 are alternately arranged at both ends of word lines WL and write digit lines WDL of the respective memory cell rows. This enables row drivers 80 to be efficiently arranged with a small area.

Read/write control circuit 30 includes a write driver control circuit 150 and a switch circuit 160. In response to an operation instruction from control circuit 5, write driver control circuit 150 sets write control signals WDTa, WDTb of each memory cell column according to the write data WD transmitted to a node N4 and the column selection result from column decoder 25. As specifically described below, write driver control circuit 150 writes data to the selected memory cell at a prescribed timing not only in data write operation but also in data read operation.

Switch circuit 160 selectively connects either a node Nr or Nw to node N4. In normal data write operation, switch circuit 160 connects node Nw to node N4 because input data DIN is transmitted from input buffer 175 to node Nw.

Read/write control circuit 30 further includes write drivers WDVb corresponding to the respective memory cell columns. Similarly, read/write control circuit 35 includes write drivers WDVa corresponding to the respective memory cell columns. In each memory cell column, write driver WDVa drives one end of a corresponding bit line BL with either power supply voltage Vcc or ground voltage GND according to a corresponding write control signal WDTa. Similarly, write driver WDVb drives the other end of a corresponding bit line BL with either power supply voltage Vcc (H level)or ground voltage GND (L level) according to a corresponding write control signal WDTb.

In data write operation, write control signals WDTa, WDTb of the selected column are respectively set to H level and L level, and vice versa according to the level of write data WD. For example, when H-level ("1") data is to be written, write control signal WDTa is set to H level and write control signal WDTb is set to L level in order to apply a data write current +Iw in the direction from write driver WDVa toward word driver WDVb. On the other hand, when L-level ("0") data is to be written, write control signal WDTb is set to H level and write control signal WDTa is set to L level in order to apply a data write current −Iw in the direction from write driver WDVb toward write driver WDVa. Hereinafter, data write currents +Iw, −Iw having different directions are sometimes generally referred to as data write current ±Iw.

In the non-selected columns, write control signals WDTa, WDTb are set to L level. Write control signals WDTa, WDTb are also set to L level in operation other than the data write operation.

When data write currents Ip, ±Iw are respectively applied to a corresponding write digit line WDL and a corresponding bit line BL, data is magnetically written to tunneling magneto-resistance element TMR according to the direction of data write current ±Iw.

The same structure is provided for bit line BL of each memory cell column. Note that, in the example of FIG. 2, write drivers WDVa, WDVb may drive a corresponding bit line with a voltage other than ground voltage GND and power supply voltage Vcc.

Hereinafter, data read operation from memory array 10 will be described.

Read/write control circuit 30 further includes a data line DIO for transmitting a voltage according to the electric resistance of the selected memory cell, and read selection gates RSG arranged between data line DIO and respective bit lines BL. Read column selection lines RCSL are respectively coupled to gates of transistors forming the read selection gates RSG. Read column selection line RCSL indicates selection/non-selection of a corresponding memory cell column. Read column selection line RCSL is activated to H level in response to selection of a corresponding memory cell column. The same structure is provided for each memory cell column. Bit lines BL on memory array 10 thus share data line DIO.

Accordingly, in data read operation, the selected memory cell is electrically coupled to data line DIO through bit line BL of the selected column and a corresponding read selection gate RSG.

Read/write control circuit 30 further includes a data read circuit 100, and a data read current supply circuit 105.

Data read current supply circuit 105 includes a current supply transistor 107 electrically coupled between power supply voltage Vcc and data line DIO. Current supply transistor 107 is a P-channel MOS transistor receiving a control signal /RE (which is activated to L level in data read operation). In data read operation, current supply transistor 107 couples data line DIO to power supply voltage Vcc to produce a data read current Is.

Data read current Is thus produced flows through a path formed from data line DIO, read selection gate RSG of the selected column, bit line BL of the selected column, tunneling magneto-resistance element TMR of the selected memory cell, access transistor ATR, and source line SL (ground voltage GND). As a result, a voltage is produced on data line DIO according to the electric resistance of the selected memory cell.

Note that FIG. 2 shows the data read current supply circuit having the simplest structure. However, in order to supply data read current Is more precisely, data read current supply circuit 105 may be a constant current supply circuit having a current-mirror structure or the like.

Data read circuit 100 further includes a switch circuit 110, voltage holding capacitors 111 to 113, sense amplifiers 120, 125, 130, and a latch circuit 140.

In each data read operation, switch circuit 110 sequentially connects nodes N1 to N3 to data line DIO one by one. Voltage holding capacitors 111 to 113 hold the respective voltages on nodes N1 to N3.

Sense amplifier 120 amplifies the voltage difference between nodes N1, N2 for output. Sense amplifier 125 amplifies the voltage difference between nodes N1, N3 for output. Sense amplifier 130 amplifies the voltage difference between the respective outputs of sense amplifiers 120, 125 for output. Latch circuit 140 latches the output voltage of sense amplifier 130 at a prescribed timing, and outputs read data RD of a level according to the storage data of the selected memory cell to node Nr.

Read data RD thus output to node Nr is output as output data DOUT from a data output terminal 4a through an output buffer 170. Input data DIN to a data input terminal 4b is transmitted to node Nw through an input buffer 175.

As described before, in normal data write operation, switch circuit 160 connects node Nw to node N4. On the other hand, in data read operation, switch circuit 160 electrically couples node Nr to node N4 in order to rewrite read data RD to the selected memory cell according to an instruction from control circuit 5.

Hereinafter, data read operation of the first embodiment using the above read/write control circuits will be described in detail.

A single data read operation of the first embodiment will be described with reference to the flowchart of FIG. 3.

Figure 3:
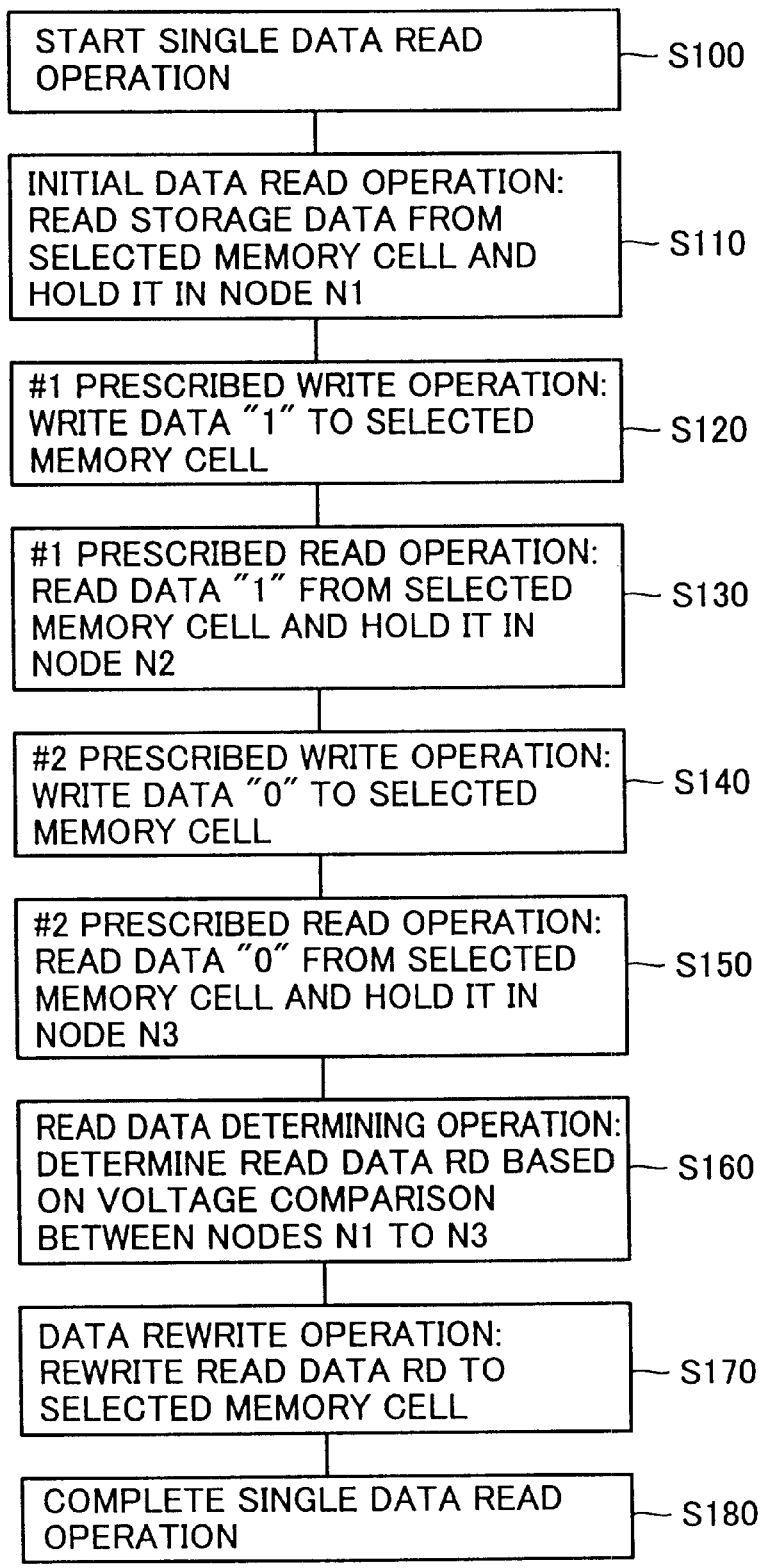
FIG. 3 is a flowchart illustrating a single data read operation of the first embodiment.

Referring to FIG. 3, when a single data read operation is started in the first embodiment (step S100), storage data is read from the selected memory cell as an initial data read operation. In the initial data read operation, the magnetization direction of the selected memory cell is the same as before the data read operation. In this state, a voltage on data line DIO is transmitted to node N1 and held therein (step S110).

Thereafter, data of a prescribed level (e.g., "1") is written to the selected memory cell as a #1 prescribed write operation. In other words, the selected memory cell is subjected to a data write magnetic field for writing the data of the prescribed level (step S120). The data of the prescribed level is then read from the selected memory cell as #1 a prescribed read operation. In this state, a voltage on data line DIO is held at node N2 (step S130).

Data of a different level (e.g., "0") from that of the #1 prescribed write operation is then written to the selected memory cell as a #2 prescribed write operation. In other words, the selected memory cell is subjected to a data write magnetic field for writing the data of that level (step S 140). The data ("0") written to the selected memory cell in #2 prescribed write operation is then read therefrom as a #2 prescribed read operation. In this state, a voltage on data line DIO is held at node N3 (step S150).

Once a series of operations from the initial data read operation to prescribed #2 read operation is completed, that is, after nodes N1 to N3 are sequentially connected to data line DIO, nodes N1 to N3 hold data line voltages corresponding to the storage data, the data "1" and the data "0", respectively. In this state, read data RD indicating the storage data of the selected memory cell is determined based on voltage comparison between nodes N1 to N3 (step S160).

Read data RD thus determined is rewritten to the selected memory cell (step S170). This enables the storage data to be reproduced in the selected memory cell subjected to the prescribed data write operations in the read operation sequence. In other words, the selected memory cell restore to the state before the data read operation.

Figure 4:
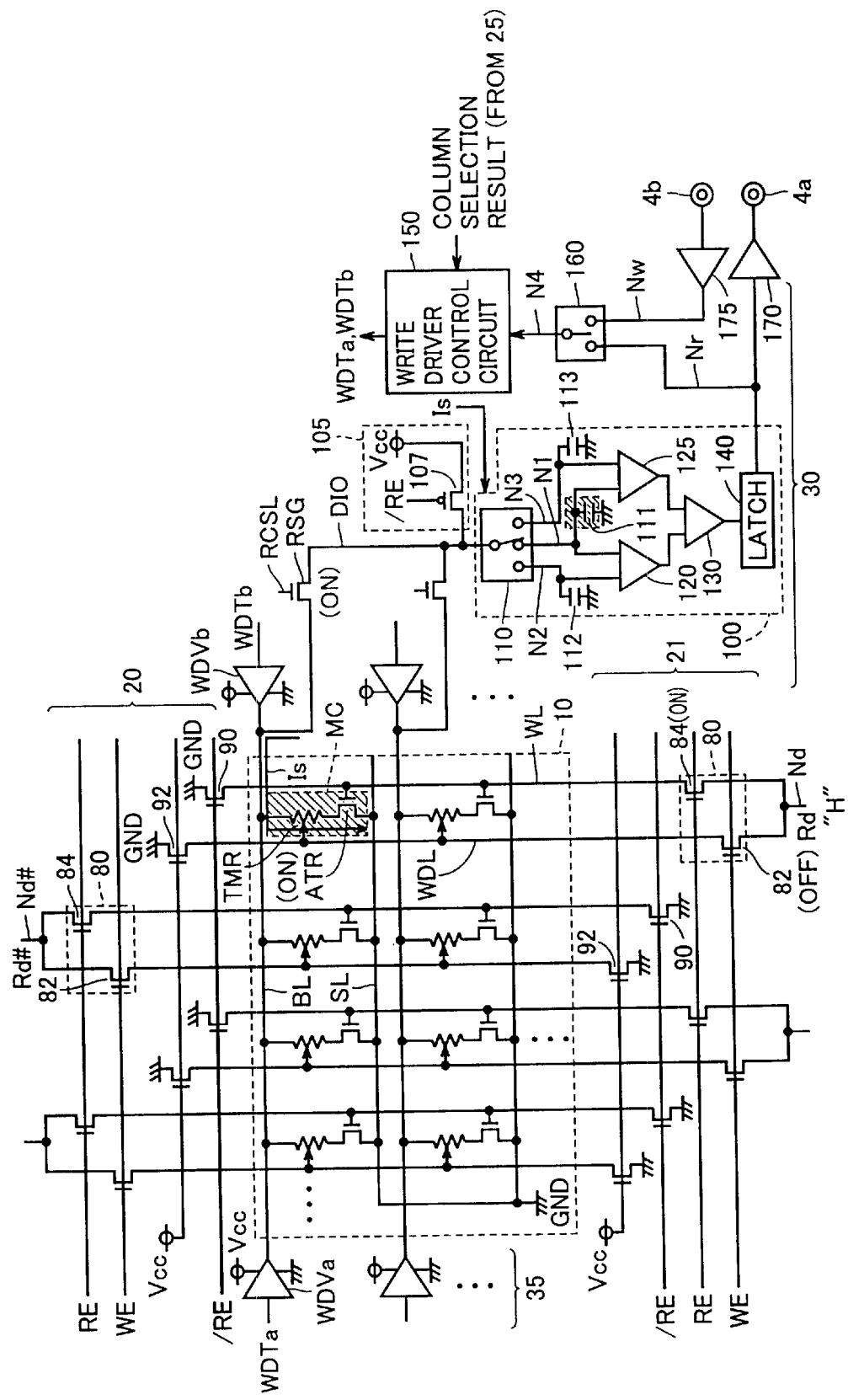
FIG. 4 is a circuit diagram illustrating operation of the read/write control circuit in an initial data read operation.

Referring to FIG. 4, in each data read operation, node Nd of the selected row is held at H level. In the initial data read operation, control signal RE is set to H level and control signal WE is set to L level. If the hatched MTJ memory cell shown in the figure is a selected memory cell to be accessed, a corresponding word line WL and a corresponding read column selection line RCSL are activated to H level. In response to this, a corresponding read selection gate RSG and access transistor ATR of the selected memory cell are turned ON, and a data read current Is flows through tunneling magneto-resistance element TMR of the selected memory cell.

As a result, a voltage according to the storage data of the selected memory cell is generated on data line DIO. In the initial data read operation, switch circuit 110 connects data line DIO to node N1. The voltage on node N1 is held in voltage holding capacitor 111. Accordingly, in the initial data read operation (step S110 of FIG. 3), a data line voltage according to the storage data of the selected memory cell is transmitted to node N1 and held therein.

Figure 5:
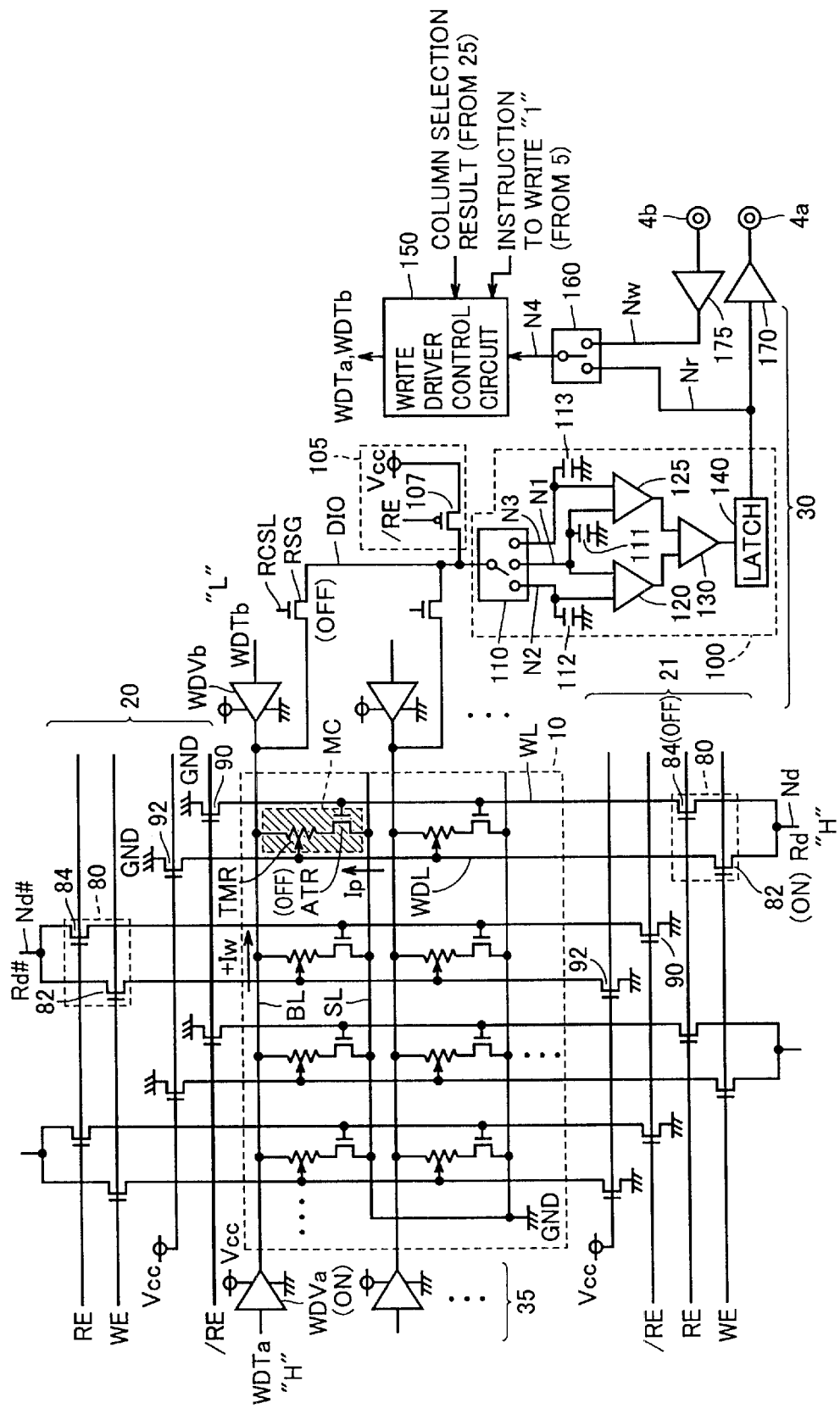
FIG. 5 is a circuit diagram illustrating operation of the read/write control circuit in a #1 prescribed write operation.

Referring to FIG. 5, in the #1 prescribed write operation, control signal RE is set to L level and control signal WE is set to H level. Moreover, each read column selection line RCSL is inactivated to L level, and read selection gate RSG of each memory cell column is turned OFF. Each bit line BL is thus disconnected from data line DIO. Switch circuit 110 does not connect data line DIO to any of nodes N1 to N3. Control circuit 5 gives an instruction to write data "1" to write driver control circuit 150.

Write digit line WDL of the selected row is activated, and a data write current Ip is applied thereto. Moreover, a data write current +Iw for writing the prescribed data ("1") is applied to the bit line of the selected column in the direction from write driver WDVa toward write driver WDVb.

More specifically, write driver control circuit 150 sets write control signal WDTa of the selected column to H level and write control signal WDTb of the selected column to L level in response to the write instruction from control circuit 5. Note that write control signals WDTa, WDTb of the other memory cell columns are set to L level. As a result, the data of the prescribed level ("1") is forcibly written to the selected memory cell.

Figure 6:
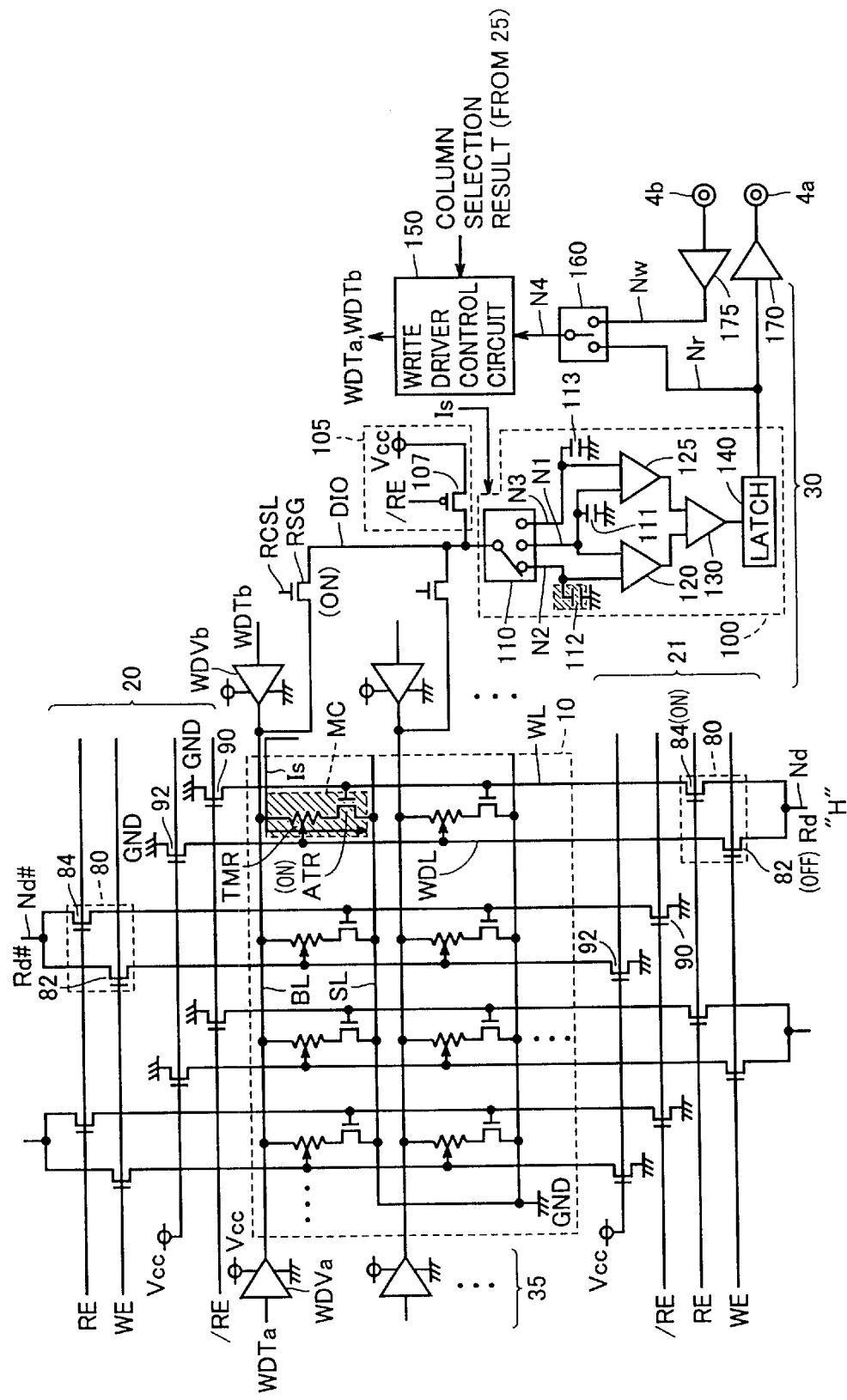
FIG. 6 is a circuit diagram illustrating operation of the read/write control circuit in a #1 prescribed read operation.

Referring to FIG. 6, in the #1 prescribed read operation, control signal RE is set to H level and control signal WE is set to L level. In order to read the data from the selected memory cell again, a corresponding word line WL and a corresponding read column selection line RCSL are activated to H level. Switch circuit 110 connects data line DIO to node N2. The voltage on node N2 is held in voltage holding capacitor 112.

In the #1 prescribed read operation (step S130 of FIG. 3), a data line voltage corresponding to the data "1" read from the selected memory cell is transmitted to node N2 and held therein.

Figure 7:
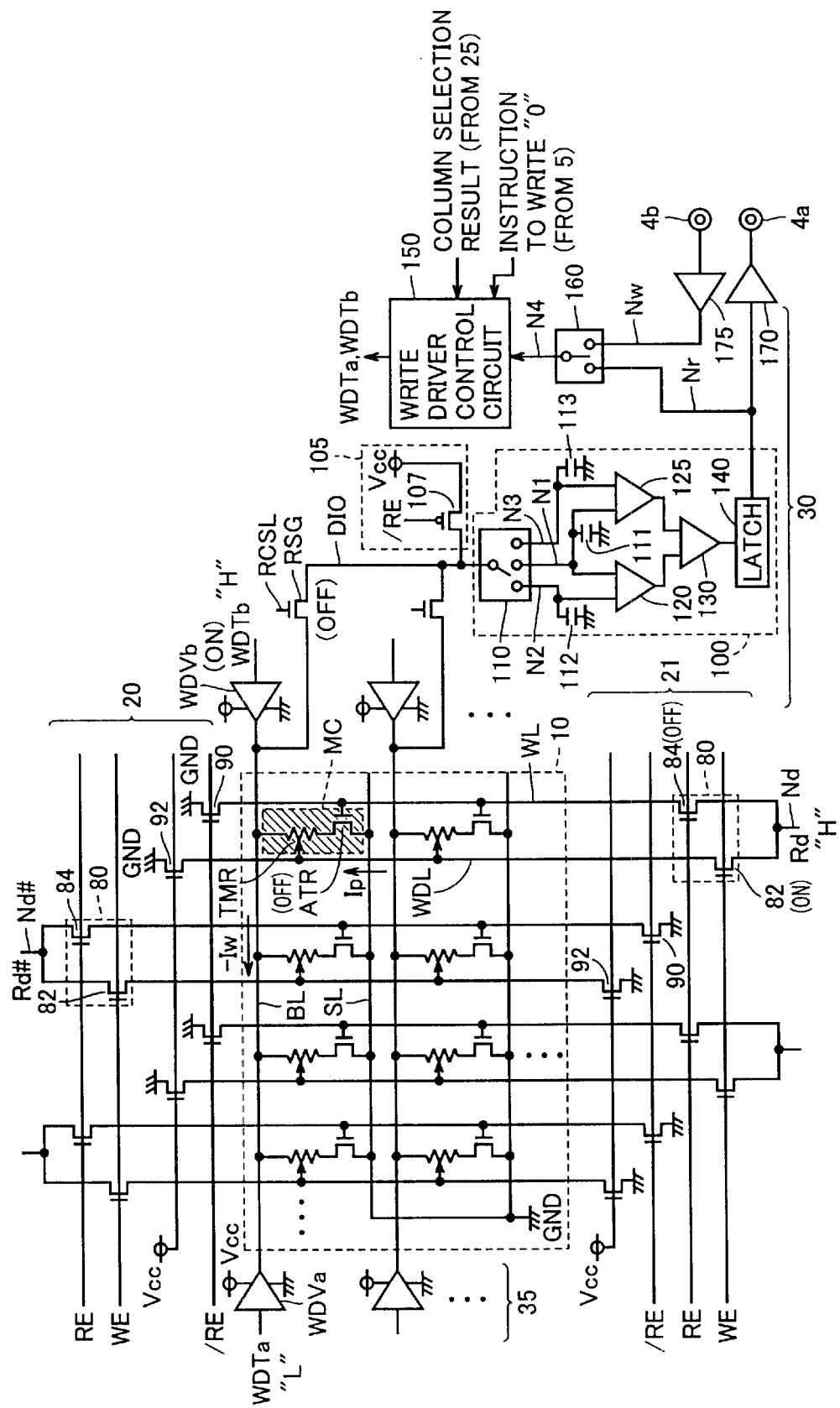
FIG. 7 is a circuit diagram illustrating operation of the read/write control circuit in a #2 prescribed write operation.

Referring to FIG. 7, in the #2 prescribed write operation, control signal RE is set to L level, control signal WE is set to H level, and each bit line BL is disconnected from data line DIO, as in the #1 prescribed write operation. Switch circuit 110 does not connect data line DIO to any of nodes N1 to N3. Control circuit 5 gives an instruction to write data "0" to write driver control circuit 150.

Accordingly, a corresponding write digit line WDL is activated and a data write current Ip is applied thereto. A data write current −Iw for writing the data ("0") is applied to the bit line of the selected column in the direction from write driver WDVb toward write driver WDVa.

More specifically, write driver control circuit 150 sets write control signal WDTa of the selected column to L level and write control signal WDTb of the selected column to H level in response to the write instruction from control circuit 5. Note that write control signals WDTa, WDTb of the other memory cell columns are set to L level. As a result, the data of a different level ("0") from that of the #1 prescribed write operation is forcibly written to the selected memory cell.

Figure 8:
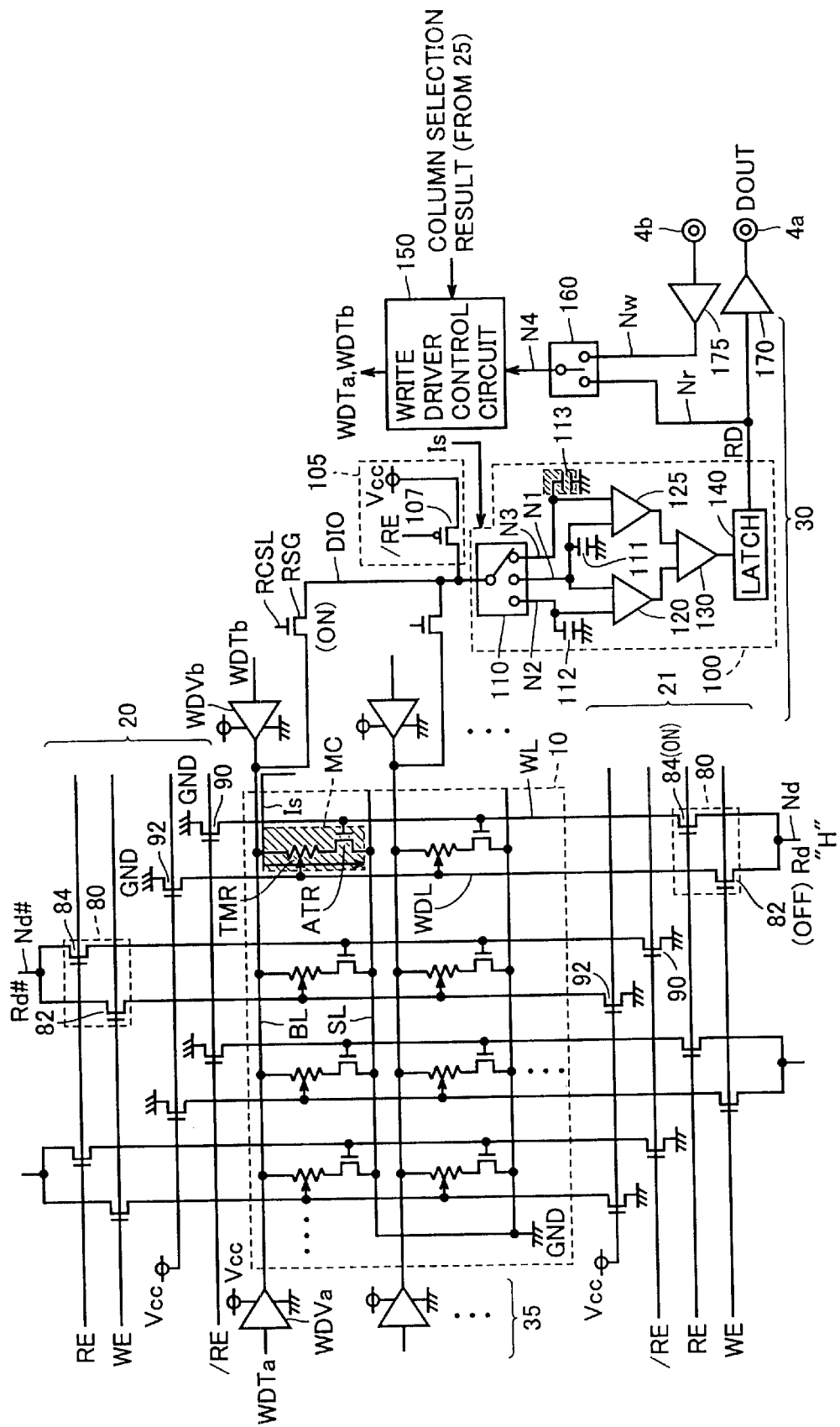
FIG. 8 is a circuit diagram illustrating operation of the read/write control circuit in a #2 prescribed read operation.

Referring to FIG. 8, in the #2 prescribed read operation, control signal RE is set to H level and control signal WE is set to L level. In order to read the data from the selected memory cell again, a corresponding word line WL and a corresponding read column selection line RCSL are activated to H level. Switch circuit 110 connects data line DIO to node N3. The voltage on node N3 is held in voltage holding capacitor 113.

In the #2 prescribed read operation (step S150 in FIG. 3), a data line voltage corresponding to the data "0" read from the selected memory cell is transmitted to node N3 and held therein.

After the #2 prescribed read operation, node N1 holds a voltage corresponding to the storage data of the selected memory cell, node N2 holds a data line voltage corresponding to the data "1" read from the selected memory cell, and node N3 holds a data line voltage corresponding to the data "0" read from the selected memory cell through respective voltage holding capacitors 111 to 113.

Since either sense amplifier 120 or 125 receives two input voltages of the same level, the output voltage thereof is hardly amplified. However, the output voltage of the other sense amplifier is significantly amplified. More specifically, provided that the selected memory cell stores data "1", the output of sense amplifier 120 is hardly amplified, whereas the output of sense amplifier 125 is amplified to the maximum. On the other hand, provided that the selected memory cell stores data "0", the output of sense amplifier 125 is hardly amplified, whereas the output of sense amplifier 120 is amplified to the maximum.

Sense amplifier 130 of the second stage produces a voltage corresponding to the storage data of the selected memory cell, based on comparison between the output voltages of sense amplifiers 120, 125 of the first stage. Latch circuit 140 holds the output of sense amplifier 130 at the timing of the data determining operation of step S160 of FIG. 3. Latch circuit 140 produces read data RD onto node Nr according to the voltage held therein.

Figure 9:
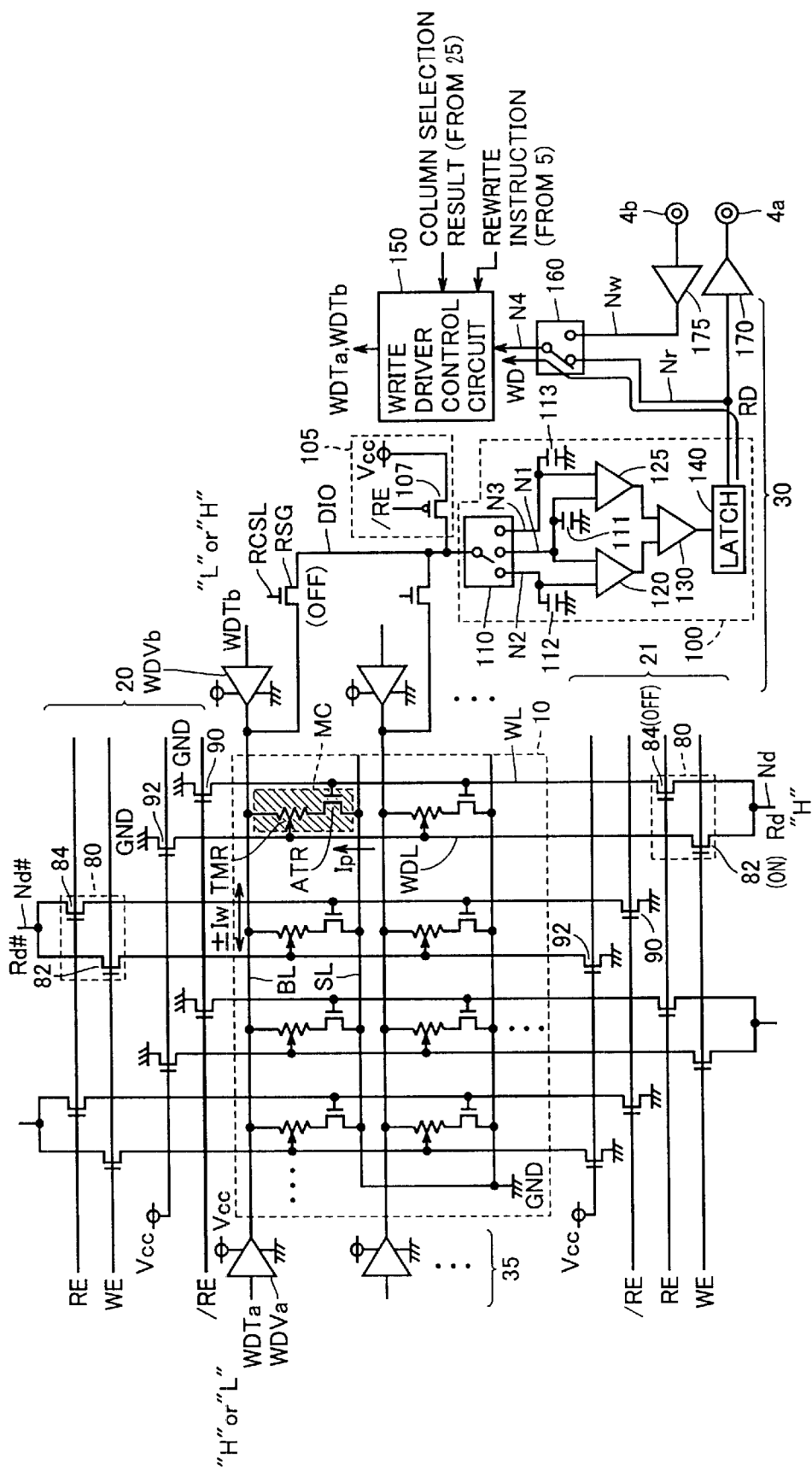
FIG. 9 is a circuit diagram illustrating operation of the read/write control circuit in a data rewrite operation.

Referring to FIG. 9, in the data rewrite operation, read data RD is rewritten to the selected memory cell. More specifically, switch circuit 160 connects nodes Nr, N4 together. Control circuit 5 gives an instruction to rewrite the data to write driver control circuit 150.

Accordingly, write driver control circuit 150 sets write control signals WDTa, WDTb of the selected column so as to apply a data write current +Iw or −Iw to bit line BL of the selected column in the direction according to the level of read data RD. Similarly, control signal WE is turned ON so that a data write current Ip is applied to write digit line WDL of the selected row.

Since read data RD that corresponds to the storage data of the selected memory cell before the data read operation is rewritten to the selected memory cell, the selected memory cell restores to the state before the data read operation.

Hereinafter, the data read operation of the first embodiment will be described with reference to FIG. 10.

Figure 10:
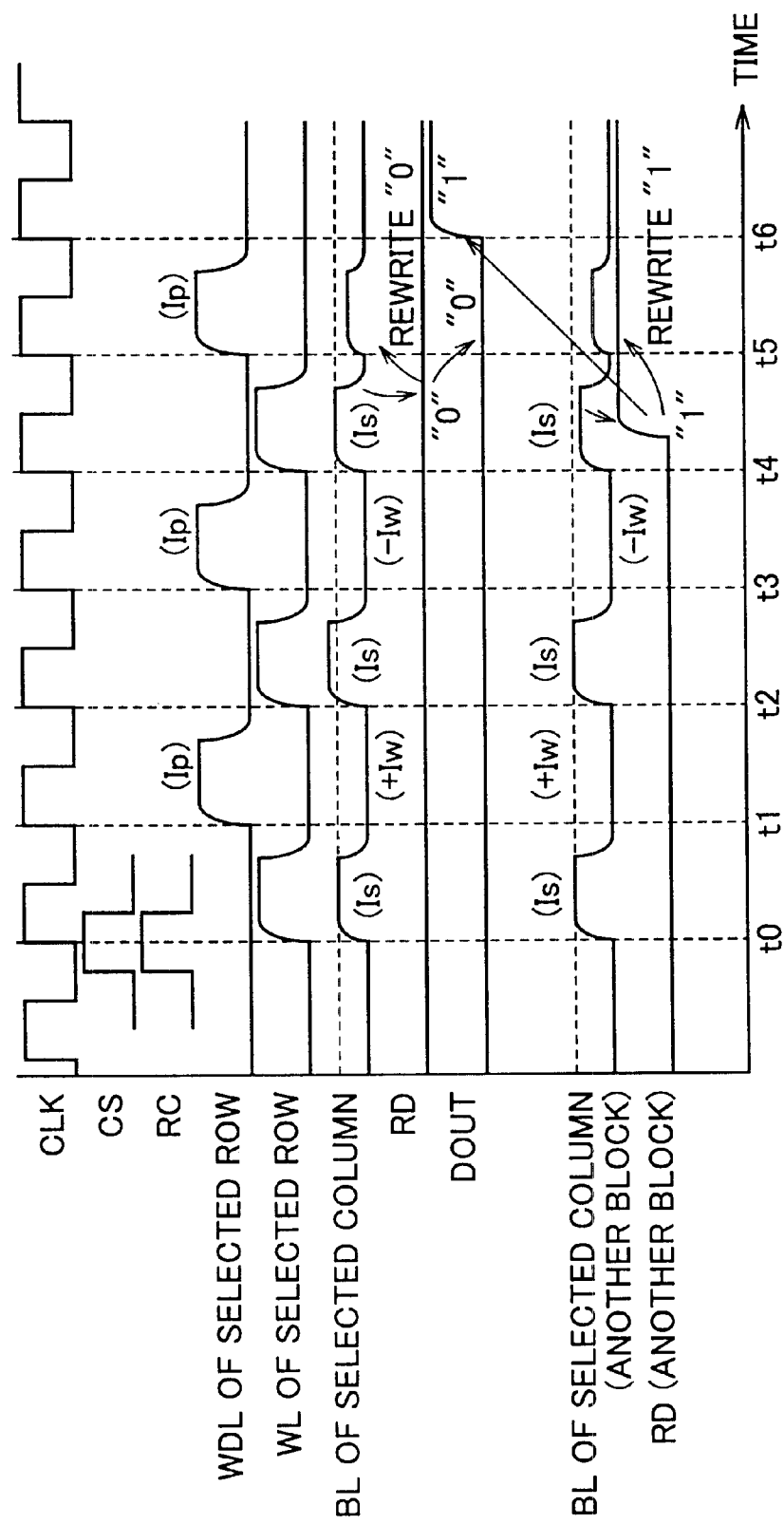
FIG. 10 is a waveform chart illustrating the data read operation of the first embodiment.

Referring to FIG. 10, each operation included in a single data read operation of FIG. 3 can be conducted in synchronization with, e.g., a clock signal CLK.

At time t0 (an activation edge of clock signal CLK), the initial data read operation is conducted in response to a chip select signal CS and a read command RC. In the initial data read operation, word line WL of the selected row is activated, and a data read current Is is applied to bit line BL of the selected column. A voltage produced on data line DIO by data read current Is, that is, a data line voltage corresponding to the storage data read from the selected memory cell, is transmitted to node N1 and held therein.

The prescribed #1 write operation is conducted at time t1 (the following activation edge of clock signal CLK). A data write current Ip is applied to write digit line WDL of the selected row and a data write current +Iw is applied to bit line BL of the selected column. Data of a prescribed level ("1") is thus forcibly written to the selected memory cell.

The prescribed #1 read operation is conducted at time t2 (the following activation edge of clock signal CLK). More specifically, word line WL of the selected row is activated and a data read current Is is applied to bit line BL of the selected column. A voltage produced on data line DIO by data read current Is, that is, a data line voltage corresponding to the data "1" read from the selected memory cell, is transmitted to node N2 and held therein.

The #2 prescribed write operation is conducted at time t3 (the following activation edge of clock signal CLK). A data write current Ip is applied to write digit line WDL of the selected row and a data write current −Iw is applied to bit line BL of the selected column. Data of a different level ("0") from that of the #1 prescribed write operation is thus forcibly written to the selected memory cell.

The #2 prescribed read operation is conducted at time t4 (the following activation edge of clock signal CLK). More specifically, word line WL of the selected row is activated and a data read current Is is applied to bit line BL of the selected column. A data line voltage corresponding to the data "0" read from the selected memory cell is transmitted to node N3 and held therein.

After the #2 prescribed read operation, nodes N1 to N3 hold the voltages corresponding to the storage data of the selected memory cell, data "1" and data "0", respectively. Read data RD can be produced based on the voltages on nodes N1 to N3.

At time t5 (the following activation edge of clock signal CLK), output data DOUT corresponding to read data RD is output from data output terminal 4a. The data rewrite operation to the selected memory cell is conducted in parallel. More specifically, a data write current Ip is applied to write digit line WDL of the selected row, and either a data write current +Iw or −Iw is applied to bit line BL of the selected column according to the level of read data RD. Data having the same level as that of read data RD is thus written to the selected memory cell. As a result, the selected memory cell restores to the same state as before the data read operation.

Note that the MRAM device may have a plurality of blocks each having the structure of FIG. 2 for writing and reading 1-bit data. FIG. 10 also shows the data read operation in such a MRAM device.

In the MRAM device having a plurality of blocks, the data read operation of the blocks is conducted in parallel according to the flow of FIG. 3. In other words, the same data read operation is conducted in the blocks each having the structure of FIG. 2. In each block, read data RD from the selected memory cell is produced at time t4.

In this case, read data RD from each of the plurality of blocks can be output as output data DOUT in a burst manner from, e.g., time t5 (the following activation edge of clock signal CLK). In the example of FIG. 10, read data RD from a block is output as output data DOUT ("0") at time t5, and read data RD from another block is output as output data DOUT ("1") at time t6 (the following activation edge of clock signal CLK).

Note that, in the example of FIG. 10, the operations included in a single data read operation are sequentially conducted in response to the respective activation edges of clock signal CLK. However, the present invention is not limited to this. More specifically, an internal timing control signal may be produced in response to clock signal CLK so that a single data read operation of FIG. 3 is conducted within one clock cycle of clock signal CLK in response to the timing control signal. The number of clock cycles (clock signal CLK) required for a single data read operation is determined as appropriate according to the relation between the time required for a single data read operation and the frequency of clock signal CLK serving as an operation clock.

According to the first embodiment, the data read operation can be conducted by merely accessing the selected memory cell without using a reference cell. In other words, read data is produced based on the comparison between the voltages on the same data read path including the same memory cell, the same bit line, the same data line and the same sense amplifier. Since no reference cell is required, data can be stored in each MTJ memory cell and every MTJ memory cell can be used as a valid bit.

Accordingly, the data read operation can be conducted with improved accuracy without being subjected to the influences such as an offset resulting from manufacturing variation of the circuits included in the data read path. In other words, the data read operation can be conducted with higher accuracy regardless of the influences such as manufacturing variation, as compared to the case where the data read operation from the selected memory cell is conducted based on the comparison with another memory cell (such as a reference cell) and corresponding data read circuitry.

Modification of First Embodiment

Figure 11:
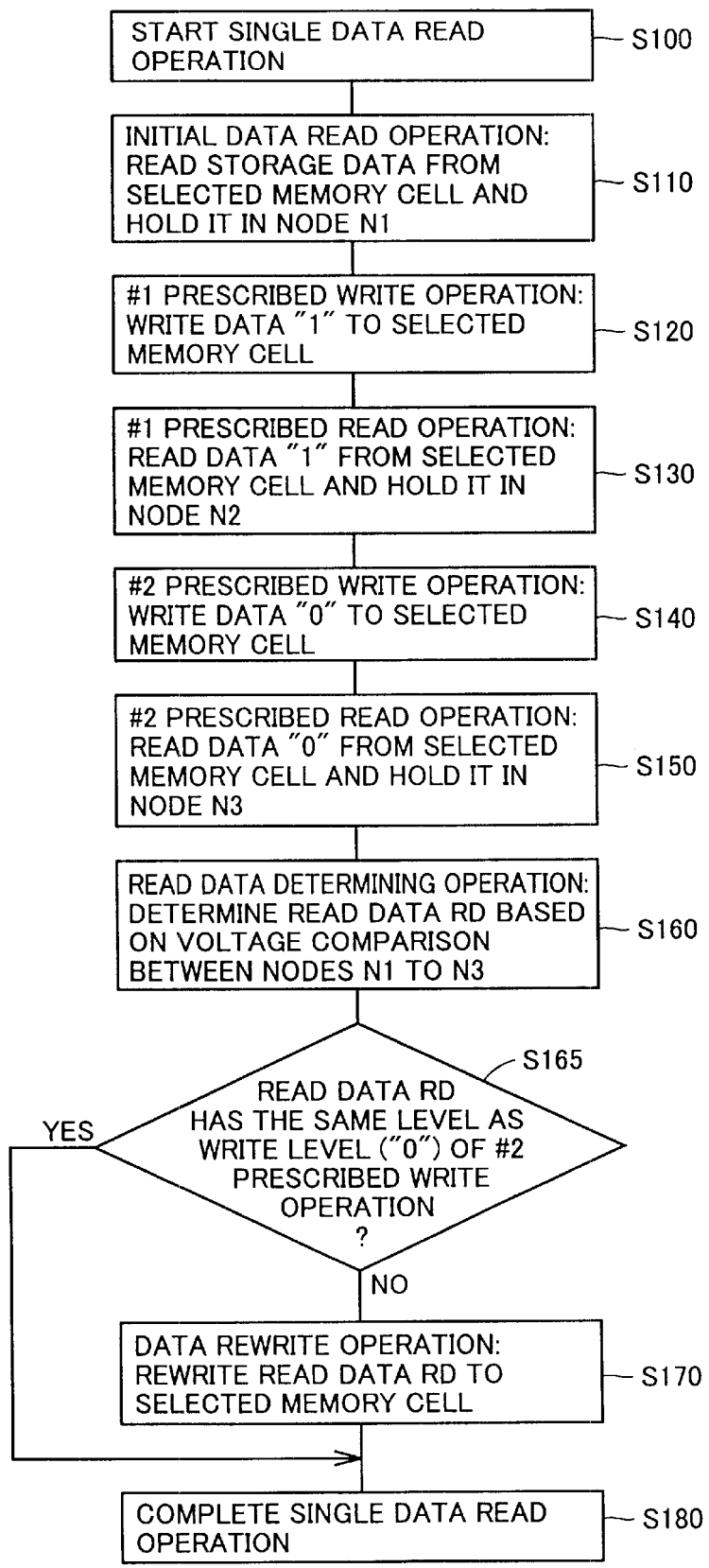
FIG. 11 is a flowchart illustrating a single data read operation in a modification of the first embodiment.

Referring to FIG. 11, the data read operation according to a modification of the first embodiment is different from that of the first embodiment (the flowchart of FIG. 3) in that the step of determining whether the data rewrite operation is required or not (step S165) is conducted between the step of determining the read data (step S160) and the step of conducting the data rewrite operation (step S170).

In step S165, it is determined whether read data RD determined in step S160 has the same level as that of the data ("0") written in the #2 prescribed write operation. If both data have the same level, the selected memory cell already stores the data of the same level as that of the data (read data RD) to be rewritten in the following step S170. Therefore, the data rewrite operation need not be conducted.

If the storage data of the selected memory cell has the same level as that of the determined read data RD before the data rewrite operation, the data rewrite operation (step S170) is skipped, and the single data read operation is completed (step S180). Otherwise, the data rewrite operation is conducted (step S170) as in the first embodiment. As a result, an unnecessary rewrite operation is omitted, enabling reduction in current consumption of the data read operation.

Note that, in the first embodiment and the modification thereof, the data "1" and "0" are forcibly written to the selected memory cell in the #1 and #2 prescribed write operations, respectively. However, the data levels in these operations may be reversed. More specifically, it is also possible to write the data "0" in the #1 prescribed write operation and the data "1" in the #2 prescribed write operation.

In the first embodiment and the modification thereof, a single data read operation includes two prescribed write operations and two prescribed read operations for the two data levels "1" and "0", respectively. However, a single data read operation may alternatively include a single prescribed write operation and a single prescribed read operation for either the data level "1" or "0".

In this case, read data RD may be produced based on whether or not the difference between the data line voltages in the initial data read operation and in the prescribed read operation after the prescribed write operation has at least a prescribed value. For example, such data read operation can be realized by eliminating both voltage holding capacitor 113 of node N3 and sense amplifier 125 from data read circuit 100 of FIG. 2 and applying an intermediate reference voltage as one input of sense amplifier 130. This reduces the number of elements in data read circuit 100, enabling reduction in area and costs.

Second Embodiment

In the structure described in the second embodiment, data read operation is conducted with a simplified data read circuit. As in the first embodiment, data read operation is conducted by merely accessing the selected memory cell.

Figure 12:
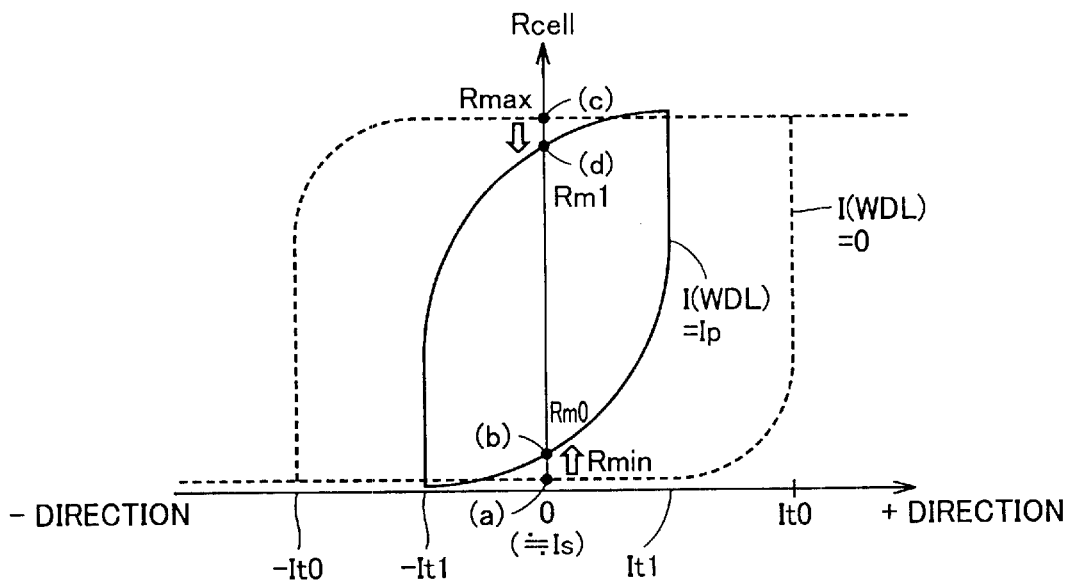
FIG. 12 is a conceptual diagram illustrating principles of the data read operation of the second embodiment.

FIG. 12 shows the relation between a data write current supplied to the MTJ memory cell and an electric resistance of the MTJ memory cell (hysteresis characteristics).

Referring to FIG. 12, the abscissa indicates a bit line current I(BL) flowing through a bit line, and the ordinate indicates an electric resistance R cell of the MTJ memory cell. Bit line current I(BL) produces a magnetic field in the easy-axis (EA) direction in free magnetic layer VL of the MTJ memory cell. On the other hand, digit line current I(WDL) flowing through a write digit line WDL produces a magnetic field in the hard-axis (HA) direction in free magnetic layer VL.

Accordingly, when bit line current I(BL) exceeds a threshold value for switching the magnetization direction of free magnetic layer VL, the magnetization direction of free magnetic layer VL is inverted, and memory cell resistance R cell varies. In FIG. 12, memory cell resistance R cell is maximized (Rmax) when bit line current I(BL) in the positive direction exceeds the threshold value. Memory cell resistance R cell is minimized (Rmin) when bit line current I(BL) in the negative direction exceeds the threshold value. The threshold value of bit line current I(BL) varies depending on digit line current I(WDL) flowing through write digit line WDL.

When digit line current I(WDL) flowing through write digit line WDL is zero, memory cell resistance R cell has hysteresis characteristics shown by dashed line in FIG. 12. In this case, bit line current I(BL) has threshold values It0 and −It0 in the positive and negative directions, respectively.

On the other hand, when digit line current I(WDL) flows through write digit line WDL, bit line current I(BL) has reduced threshold values. When digit line current I(WDL) is Ip, memory cell resistance R cell has hysteresis characteristics shown by solid line in FIG. 12. Due to the magnetic field of the hard-axis direction produced by digit line current I(WDL), bit line current I(BL) has threshold values It1 (It1<It0) and −It1 (−It1>−It0) in the positive and negative directions, respectively. The hysteresis characteristics indicate the behavior of memory cell resistance R cell in data write operation. Accordingly, bit line current I(BL) in the data write operation, that is, data write currents +Iw and −Iw, is set to It1<+Iw<It0 and −It0<−Iw<−It1.

On the other hand, bit line current I(BL) in the data read operation, that is, data read current Is, flows as a current for charging data line DIO having the selected memory cell and parasitic capacitance connected thereto as RC (resistance-capacitance) load. Therefore, data read current Is is commonly two or three orders smaller than bit line current I(BL) in the data write operation, that is, data write current ±Iw. Accordingly, in FIG. 12, data read current Is can be regarded as Is ≈0.

Before data read operation, free magnetic layer VL in tunneling magneto-resistance element TMR has a magnetization direction corresponding to either the state (a) or (c) in FIG. 12 so that the selected memory cell has either electric resistance Rmin or Rmax.

Figure 13:
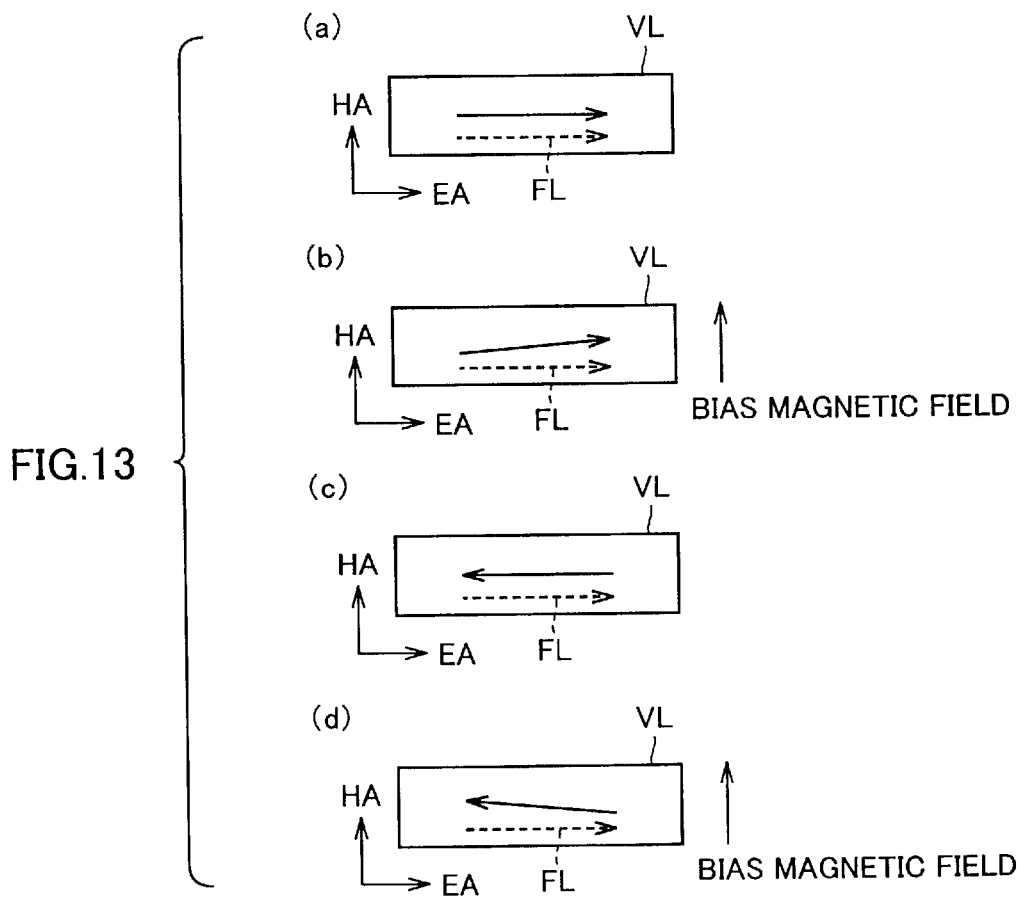
FIG. 13 is a conceptual diagram illustrating the magnetization direction of a tunneling magneto-resistance element in each state of FIG. 12.

FIG. 13 shows the magnetization direction of the tunneling magneto-resistance element in each state of FIG. 12.

In FIG. 13, (a) shows the magnetization direction in the state (a) of FIG. 12. Since free magnetic layer VL and fixed magnetic layer FL have parallel magnetization directions, memory cell resistance R cell has the minimum value Rmin.

In FIG. 13, (c) shows the magnetization direction in the state (c) of FIG. 12. Since free magnetic layer VL and fixed magnetic layer FL have antiparallel (opposite) magnetization directions, memory cell resistance R cell has the maximum value Rmax.

When a prescribed current (e.g., data write current Ip) is applied to write digit line WDL in this state, the magnetization direction of free magnetic layer VL is somewhat rotated (but is not inverted). As a result, electric resistance R cell of tunneling magneto-resistance element TMR varies.

For example, when free magnetic layer VL in the state (a) of FIG. 13 is subjected to a prescribed bias magnetic field in the hard-axis (HA) direction by digit line current I(WDL), the magnetization direction of free magnetic layer VL is somewhat rotated to form a prescribed angle with the magnetization direction of fixed magnetic layer FL, as shown in (b) of FIG. 13. Accordingly, in the state (b) of FIG. 13, memory cell resistance R cell increases from the minimum value Rmin to Rm0.

Similarly, when free magnetic layer VL in the state (c) of FIG. 13 is subjected to a prescribed bias magnetic field, the magnetization direction of free magnetic layer VL is somewhat rotated to form a prescribed angle with the magnetization direction of fixed magnetic layer FL. Accordingly, in the state (d) of FIG. 13, memory cell resistance R cell decreases from the maximum value Rmax to Rm1.

As described above, when the MTJ memory cell stores the data corresponding to the maximum value Rmax, memory cell resistance R cell thereof is reduced in response to a bias magnetic field in the hard-axis (HA) direction. On the other hand, when the MTJ memory cell stores the data corresponding to the minimum value Rmin, memory cell resistance R cell thereof is increased in response to a bias magnetic field in the hard-axis (HA) direction.

Thus, when the MTJ memory cell storing data is subjected to a bias magnetic field of the hard-axis direction, memory cell resistance R cell is varied in the positive or negative direction depending on the storage data. In other words, a change in memory cell resistance R cell that occurs in response to a bias magnetic field has a different polarity depending on the storage data level. In the second embodiment, data read operation is conducted by utilizing such magnetization characteristics of the MTJ memory cell.

Figure 14:
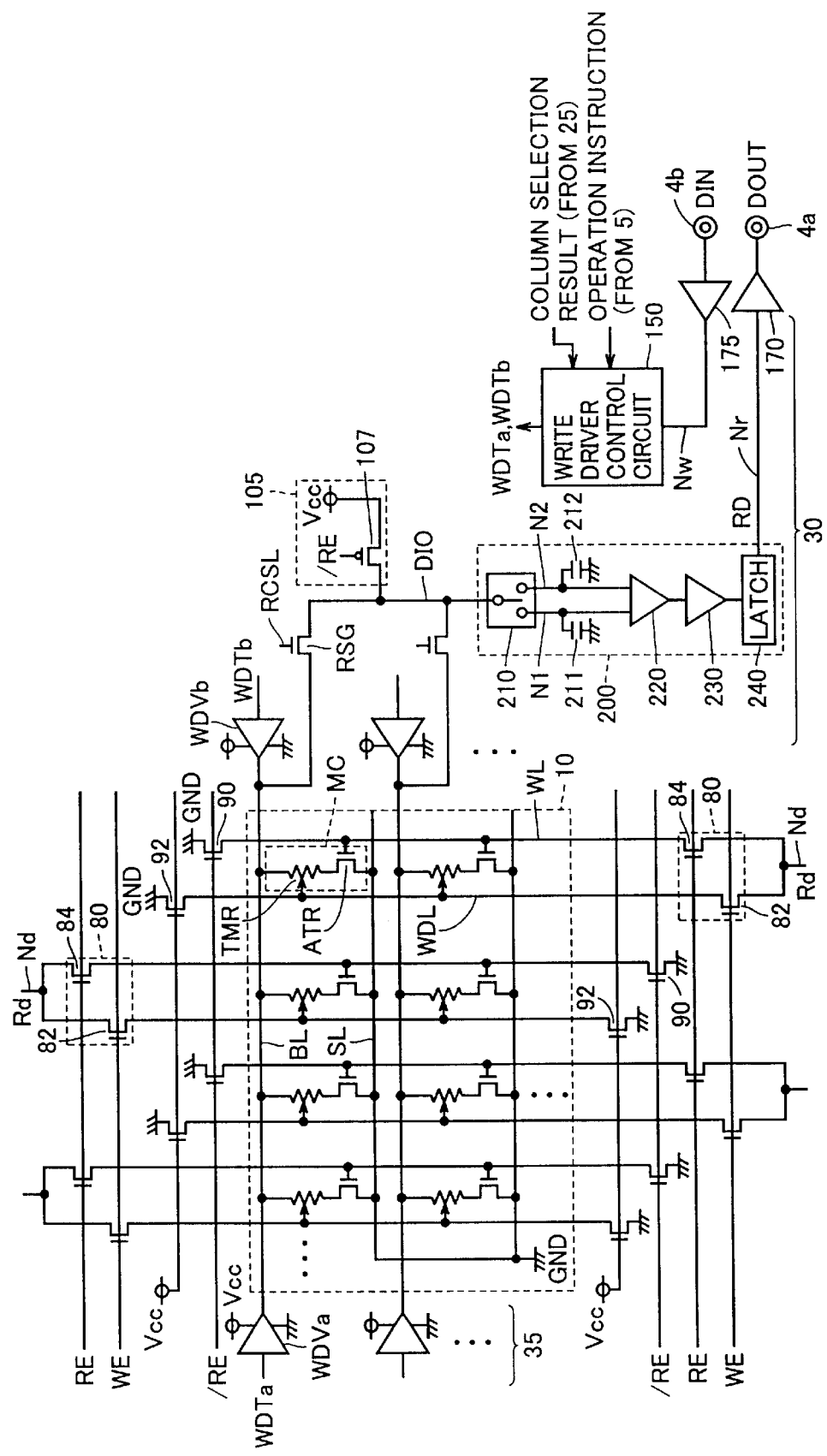
FIG. 14 is a circuit diagram of the structure of a read/write control circuit according to a second embodiment of the present invention.

Referring to FIG. 14, the second embodiment is different from the first embodiment of FIG. 2 in that read/write control circuit 30 includes a data read circuit 200 instead of data read circuit 100 and in that switch circuit 160 is eliminated.

Data read circuit 200 includes a switch circuit 210, voltage holding capacitors 211, 212, sense amplifiers 220, 230, and a latch circuit 240. Switch circuit 210 is provided between data line DIO and nodes N1, N2. Voltage holding capacitors 211, 212 correspond to nodes N1, N2, respectively.

In each data read operation, switch circuit 210 sequentially connects nodes N1, N2 to data line DIO one by one. Voltage holding capacitors 211, 212 hold the voltages on nodes N1, N2, respectively.

Sense amplifier 220 amplifies the voltage difference between nodes N1 and N2. Sense amplifier 230 of the second stage amplifies the output of sense amplifier 220 for transmission to latch circuit 240. Latch circuit 240 amplifies the output of sense amplifier 230 to the maximum at a prescribed timing, and latches the resultant value. Latch circuit 240 thus outputs read data RD having a level corresponding to the storage data of the selected memory cell to node Nr.

In the second embodiment, a single data read operation includes a first read operation and a second read operation. The first read operation corresponds to the initial data read operation of the first embodiment. The second read operation is conducted with a bias current being applied to write digit line WDL of the selected row. In particular, a data write current Ip to be applied to write digit line DL in data write operation may be used as the bias current. In this case, circuitry for supplying a bias current in data read operation is not required, whereby the circuit structure can be simplified.

In the first read operation, data is read from the selected memory cell without applying a current to a corresponding write digit line WDL (I(WDL)=0). In other words, data is read from the selected memory cell having the same magnetization direction as before the data read operation. Switch circuit 210 connects data line DIO to node N1. The data line voltage in the first read operation is held in node N1 by voltage holding capacitor 211.

In the second read operation, data is read from the selected memory cell with a bias current being applied to write digit line WDL of the selected row (I(WDL)=Ip). In other words, the second read operation is conducted with the selected memory cell being subjected to a prescribed bias magnetic field along the hard-axis direction.

In the second read operation, switch circuit 210 connects data line DIO to node N2. The data line voltage in the second read operation is thus transmitted to node N2 and held therein by voltage holding capacitor 212.

As described before, when the selected memory cell is subjected to such a bias magnetic field, memory cell resistance R cell thereof varies from the value in the first read operation (i.e., the value before the data read operation) in the positive or negative direction depending on the storage data level. Accordingly, the voltage on data line DIO in the second read operation rises or falls from the value in the first read operation.

More specifically, when the selected memory cell stores the data corresponding to electric resistance Rmax (e.g., data "1"), the data line voltage in the second read operation is higher than that in the first read operation. This is because memory cell resistance R cell is reduced in response to the bias magnetic field of digit line current I(WDL) and a current flowing through tunneling magneto-resistance element TMR is increased accordingly. On the other hand, when the selected memory cell stores the data corresponding to electric resistance Rmin (e.g., data "0"), the data line voltage in the second read operation is lower than that in the first read operation. This is because memory cell resistance R cell is increased in response to the bias magnetic field of digit line current I(WDL) and a current flowing through tunneling magneto-resistance element TMR is reduced accordingly.

Sense amplifier 220 compares the voltages held in nodes N1 and N2, that is, the data line voltages in the first and second read operations, with each other. After the second read operation, sense amplifier 230 amplifies the output of sense amplifier 220, and latch circuit 240 amplifies and latches the output of sense amplifier 230 to produce read data RD. Read data RD thus produced has a level according to the storage data in the selected memory cell.

Unlike the first embodiment, the second embodiment does not require a prescribed write operation for forcibly writing storage data of a prescribed level and a corresponding read operation.

The bias current (data write current Ip) flowing through write digit line WDL applies a magnetic field to the selected memory cell. However, this magnetic field does not invert the magnetization direction of tunneling magneto-resistance element TMR. Accordingly, as soon as application of the bias magnetic field is discontinued, the magnetization direction of the selected memory cell restores to the same state as before the data read operation. Accordingly, the data rewrite operation as in the first embodiment is not required in a single data read operation.

Write driver control circuit 150 therefore operates according to only a write sequence of the data write operation in response to an instruction from control circuit 5. Moreover, switch circuit 160 for transmitting read data RD to write driver control circuit 150 is not required. Write driver control circuit 150 need only produce write control signals WDTa, WDTh based on input data DIN to data input terminal 4b.

Figure 15:
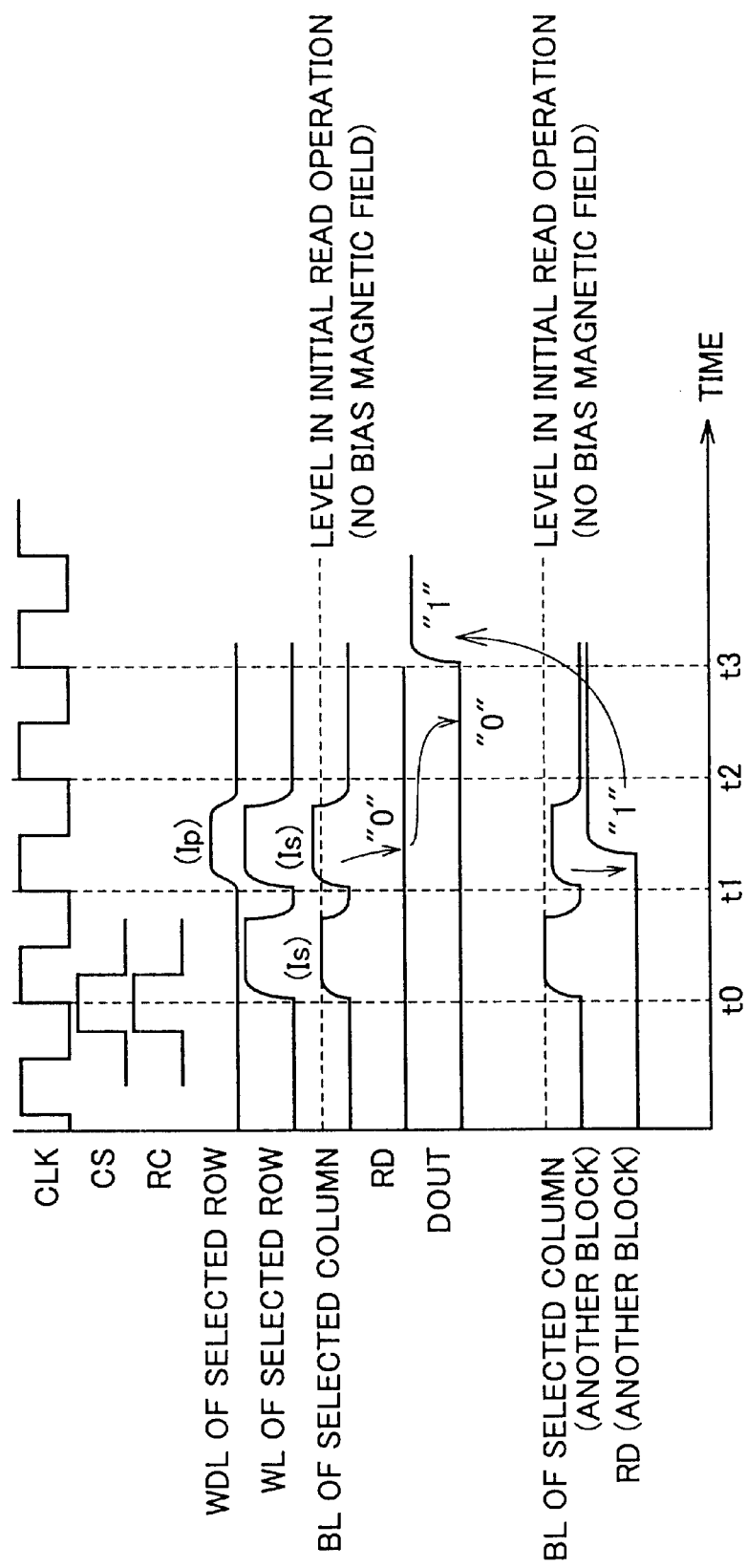
FIG. 15 is a waveform chart illustrating the data read operation of the second embodiment.

Referring to FIG. 15, a single data read operation of the second embodiment can be conducted in synchronization with, e.g., a clock signal CLK.

At time t0 (an activation edge of clock signal CLK), the first read operation corresponding to the initial data read operation (first read operation) is conducted in response to a chip select signal CL and a read command RC. In the first read operation, word line WL of the selected row is activated, and a data read current Is is supplied to bit line BL of the selected column. A voltage produced on data line DIO by data read current Is, that is, a data line voltage corresponding to the storage data read from the selected memory cell, is transmitted to node N1 and held therein.

The second read operation is conducted at time t1 (the following activation edge of clock signal CLK). More specifically, with a bias current (equivalent to a data write current Ip) being applied to write digit line WDL of the selected row, word line WL of the selected row is activated. Moreover, a data read current Is is supplied to bit line BL of the selected column. The voltage thus produced on data line DIO is transmitted to node N2 and held therein. After the second read operation, read data RD can be produced based on the voltage comparison between nodes N1 and N2.

At time t2 (the following activation edge of clock signal CLK), output data DOUT corresponding to read data RD is output from data output terminal 4a.

Note that, in the second embodiment as well, the MRAM device may have a plurality of blocks each having the structure of FIG. 14 for reading and writing 1-bit data as described in connection with FIG. 10. In this case as well, the same data read operation is conducted in each block in parallel, whereby read data RD from each block can be produced by the second read operation at time t1. Accordingly, read data RD from each of the plurality of blocks can be output as output data DOUT in a burst manner from time t2 (the following activation edge of clock signal CLK). In the example of FIG. 15, read data RD from a block is output as output data DOUT ("0") at time t2, and read data RD from another block is output as output data DOUT ("1") at time t3 (the following activation edge of clock signal CLK).

Note that, in the example of FIG. 15 as well, the operations included in a single data read operation are sequentially conducted in response to the respective activation edges of clock signal CLK. However, the present invention is not limited to this. More specifically, an internal timing control signal may be produced in response to clock signal CLK so that a single data read operation of the second embodiment is conducted within one clock cycle of clock signal CLK in response to the timing control signal. As described before, the number of clock cycles (clock signal CLK) required for a single data read operation is determined as appropriate according to the relation between the time required for a single data read operation and the frequency of the operation clock.

As in the first embodiment, the data read operation of the second embodiment can be conducted with high accuracy by merely accessing the selected memory cell without using a reference cell. Moreover, the data read circuit requires a reduced number of sense amplifiers and therefore compares a reduced number of voltages with each other. This reduces the number of elements in the data read circuit, enabling reduction in area and costs. This also reduces the influences of the offset in the voltage comparison operation, whereby the data read operation can be conducted with further improved accuracy.

Moreover, the data read operation does not require a data rewrite operation to the selected memory cell. Accordingly, the read operation speed is improved over the first embodiment.

Modification of Second Embodiment

Figure 16:
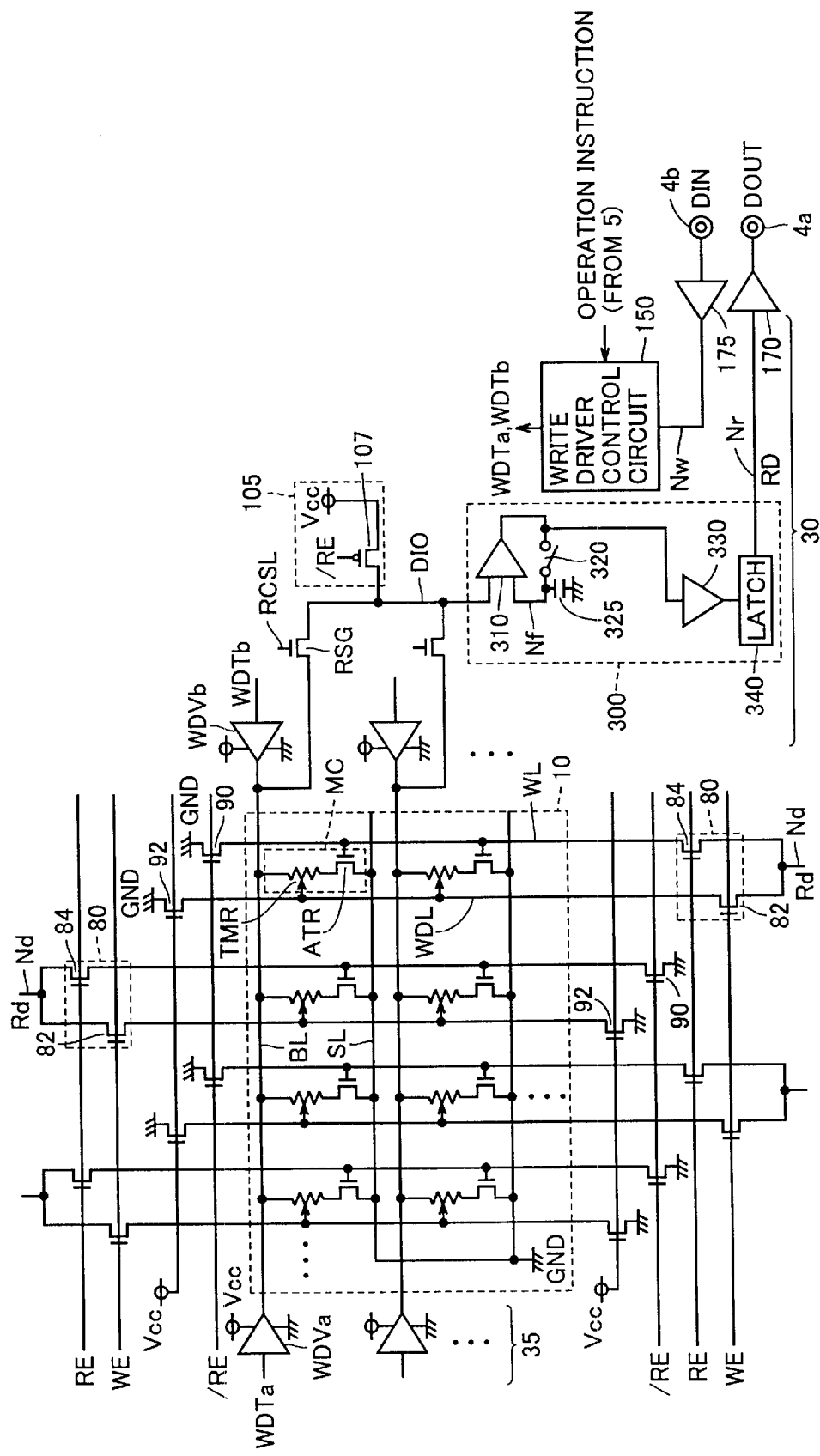
FIG. 16 is a circuit diagram of the structure of a read/write control circuit according to a modification of the second embodiment.

Referring to FIG. 16, a modification of the second embodiment is different from the second embodiment in FIG. 14 in that the read/write control circuit includes a data read circuit 300 instead of data read circuit 200. Since the structure and operation are otherwise the same as those of the second embodiment, detailed description thereof will not be repeated.

Data read circuit 300 includes a sense amplifier 310 for amplifying the voltage difference between data line DIO and a node Nf, a negative feedback switch 320 for feeding the output of sense amplifier 310 back to node Nf, a voltage holding capacitor 325 for holding a voltage on node Nf, a sense amplifier 330 for amplifying the output of sense amplifier 310, and a latch circuit 340 for amplifying and latching the output of sense amplifier 330 at a prescribed timing to produce read data RD onto node Nr.

In the data read operation according to the modification of the second embodiment, word line WL and read column selection line RCSL corresponding to the selected memory cell are activated to H level with a digit line current I(WDL)=0 and with negative feedback switch 320 being turned ON. The same data read operation as that of the first read operation in the second embodiment is thus conducted for the selected memory cell.

In the first read operation, negative feedback of sense amplifier 310 makes the voltage on node Nf closer to the voltage on data line DIO, that is, the voltage according to the storage data of the selected memory cell. Once the voltage on node Nf becomes stable, negative feedback switch 320 is turned OFF.

After negative feedback switch 320 is turned OFF, a bias current is gradually supplied to write digit line WDL of the selected row while maintaining the active state of word line WL and read column selection line RCSL corresponding to the selected memory cell. The same data read operation as that of the second read operation in the second embodiment is thus conducted for the selected memory cell.

As a result, memory cell resistance R cell of the selected memory cell varies in the positive or negative direction depending on the storage data level. Accordingly, the voltage on data line DIO gradually rises or falls according to the storage data level of the selected memory cell.

The output of sense amplifier 310 also has different voltage levels depending on the storage data level of the selected memory cell. As a result, read data RD having a level corresponding to the storage data level of the selected memory cell can be produced according to the output of sense amplifier 310 at a prescribed timing after negative feedback switch 320 is turned OFF and bias current Ip is supplied to write digit line WDL. In the data read operation according to the modification of the second embodiment, the first and second read operations in the second embodiment are conducted continuously.

With the above structure, accurate data read operation can be conducted at a high speed as in the second embodiment.

Moreover, in the modification of the second embodiment, the data line voltage according to the storage data of the selected memory cell is obtained by using the negative feedback of a single sense amplifier 310. This suppresses the offset in the sense amplifier, enabling further improvement in accuracy of the data read operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
    a plurality of memory cells each having an electric resistance according to a magnetization direction, wherein each memory cell is magnetized in a direction according to storage data thereof having either a first or second level;
    a data line that is electrically coupled to a selected memory cell for a prescribed period in data read operation;
    a read current supply circuit for supplying a data read current to said data line in order to produce a voltage according to the electric resistance of said selected memory cell onto said data line; and
    a data read circuit for producing read data corresponding to the storage data of said selected memory cell, based on a voltage on said data line electrically coupled to said selected memory cell in a first state and a voltage on said data line electrically coupled to said selected memory cell in a second state, said first state being a state where said selected memory cell has a same magnetization direction as before said data read operation, and said second stage being a state after said selected memory cell is subjected to a prescribed magnetic field.

2. The thin film magnetic memory device according to claim 1, further comprising:
    a write control circuit for writing said storage data to one of said plurality of memory cells, wherein
        said selected memory cell changes from said first state to said second state when said write control circuit writes storage data of a prescribed level thereto in a single data read operation, and
        said write control circuit performs a rewrite operation for rewriting storage data having a same level as that of said produced read data to said selected memory cell in said single data read operation.

3. The thin film magnetic memory device according to claim 2, wherein said write control circuit skips said rewrite operation when the storage data in said selected memory cell has a same level as that of said produced read data before said rewrite operation.

4. The thin film magnetic memory device according to claim 2, wherein
    said selected memory cell changes from said second state to a third state when said write control circuit writes storage data having a level different from said prescribed level thereto, and
    said data read circuit produces said read data according to respective voltages on said data line electrically coupled to said selected memory cell in said first, second and third states.

5. The thin film magnetic memory device according to claim 4, wherein said data read circuit includes
    a switch circuit for sequentially switching connection of said data line in said single data read operation,
    a first node that is connected to said data line by said switch circuit in said first state,
    a second node that is connected to said data line by said switch circuit in said second state,
    a third node that is connected to said data line by said switch circuit in said third state,
    a voltage holding portion for holding respective voltages on said first, second and third nodes,
    a first sense amplifier for amplifying a voltage difference between said first and second nodes,
    a second sense amplifier for amplifying a voltage difference between said first and third nodes,
    a third sense amplifier for amplifying a voltage difference between respective outputs of said first and second sense amplifiers, and
    a latch circuit for producing said read data according to an output of said third sense amplifier after said first, second and third nodes are connected to said data line.

6. The thin film magnetic memory device according to claim 4, wherein said write control circuit skips said rewrite operation when the storage data in said selected memory cell has a same level as that of said produced read data before said rewrite operation.

7. The thin film magnetic memory device according to claim 1, wherein
    said data read circuit includes
        a plurality of nodes,
        a plurality of voltage holding circuits for holding voltages on said plurality of nodes, respectively,
        a switch circuit provided between said data line and said plurality of nodes, for sequentially connecting said plurality of nodes to said data line one by one in a prescribed order in a single data read operation, and
        a read data producing circuit for producing said read data according to the respective voltages on said plurality of nodes, and
    said switch circuit connects one of said plurality of nodes to said data line electrically coupled to said selected memory cell in said first state, and connects another one of said plurality of nodes to said data line electrically coupled to said selected memory cell in said second state.

8. The thin film magnetic memory device according to claim 1, wherein
    each memory cell is magnetized along an easy-axis direction according to said storage data,
    said thin film magnetic memory device further comprising:
        a bias magnetic field applying portion for applying a prescribed bias magnetic field to said selected memory cell, said prescribed bias magnetic field having a component along a hard-axis direction, wherein
            said selected memory cell changes from said first state to said second state when said bias magnetic field is applied thereto.

9. The thin film magnetic memory device according to claim 8, wherein said data read circuit includes
    a switch circuit for sequentially switching connection of said data line in a single data read operation,
    a first node that is connected to said data line by said switch circuit in said first state,
    a second node that is connected to said data line by said switch circuit in said second state, a voltage holding portion for holding respective voltages on said first and second nodes, a sense amplifier for amplifying a voltage difference between said first and second nodes, and a latch circuit for producing said read data according to an output of said sense amplifier after said first and second nodes are connected to said data line.

10. The thin film magnetic memory device according to claim 8, wherein a change in electric resistance of said selected memory cell between said first and second states has a different polarity depending on a level of said storage data.

11. The thin film magnetic memory device according to claim 8, wherein said selected memory cell is continuously changed from said first state to said second state in a single data read operation.

12. The thin film magnetic memory device according to claim 8, wherein said data read circuit includes a sense amplifier for amplifying a voltage difference between said data line electrically coupled to said selected memory cell and a first node, a voltage holding portion for holding a voltage on said first node, a switch circuit for connecting an output node of said sense amplifier to said first node in said first state, and disconnecting said output node of said sense amplifier from said first node in said second state, and a read data producing circuit for producing said read data according to a voltage on said output node in said second state.

13. The thin film magnetic memory device according to claim 8, wherein said bias magnetic field applying portion includes a plurality of write digit lines arranged respectively corresponding to memory cell rows, and a row driver for activating one of said write digit lines corresponding to a selected row according to a row selection result, in data write operation, a current for generating a prescribed magnetic field along said hard-axis direction is applied to said write digit line activated by said row driver, and in said second state of said data read operation, said row driver activates said write digit line of said selected row in a same manner as that in said data write operation.

14. The thin film magnetic memory device according to claim 1, wherein every memory cell stores data as a valid bit.

* * * * *